US012107216B2

(12) United States Patent
Lee et al.

(10) Patent No.: US 12,107,216 B2
(45) Date of Patent: Oct. 1, 2024

(54) SOLID ELECTROLYTE, INTERMEDIATE OF SOLID ELECTROLYTE, SECONDARY BATTERY COMPRISING THE SAME, AND METHOD OF FABRICATING THE SAME

(71) Applicant: INDUSTRY-UNIVERSITY COOPERATION FOUNDATION HANYANG UNIVERSITY ERICA CAMPUS, Ansan-Si (KR)

(72) Inventors: Jung-Ho Lee, Ansan-si (KR); Sambhaji Shivaji Shinde, Ansan-si (KR); Donghyung Kim, Ansan-si (KR)

(73) Assignee: INDUSTRY—UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 963 days.

(21) Appl. No.: 17/072,176

(22) Filed: Oct. 16, 2020

(65) Prior Publication Data

US 2021/0075061 A1    Mar. 11, 2021

Related U.S. Application Data

(63) Continuation of application No. PCT/KR2020/014077, filed on Oct. 15, 2020, and a
(Continued)

(30) Foreign Application Priority Data

| Apr. 16, 2018 | (KR) | 10-2018-0043847 |
| Apr. 16, 2018 | (KR) | 10-2018-0043850 |
| Oct. 15, 2019 | (KR) | 10-2019-0127836 |

(51) Int. Cl.
*H01M 10/0564* (2010.01)
*H01M 10/0525* (2010.01)
(Continued)

(52) U.S. Cl.
CPC ... *H01M 10/0564* (2013.01); *H01M 10/0525* (2013.01); *H10N 30/857* (2023.02);
(Continued)

(58) Field of Classification Search
None
See application file for complete search history.

(56) References Cited

U.S. PATENT DOCUMENTS 9,164,803 B2    10/2015    Kishan et al.
9,356,318 B2    5/2016    Fujioka et al.
(Continued)

FOREIGN PATENT DOCUMENTS

CN    106715389 A    5/2017
EP    3284786 A1    2/2018
(Continued)

OTHER PUBLICATIONS

Office Action in Japan Patent Application 2020-556938 (dated Jan. 11, 2022).
(Continued)

*Primary Examiner* — Robert S Carrico
(74) *Attorney, Agent, or Firm* — Finch & Maloney PLLC

(57) ABSTRACT

A solid electrolyte is provided. The solid electrolyte may comprise a compound in which cations including thiophenium and anions including fluorohydrogenate are bonded.

13 Claims, 20 Drawing Sheets

Related U.S. Application Data continuation-in-part of application No. PCT/KR2019/004596, filed on Apr. 16, 2019.

(51) Int. Cl.
  *H10N 30/30* (2023.01)
  *H10N 30/857* (2023.01)
(52) U.S. Cl.
  CPC ............... *H01M 2300/0025* (2013.01); *H01M 2300/0065* (2013.01); *H10N 30/302* (2023.02)

(56) References Cited

U.S. PATENT DOCUMENTS

| | | |
|---|---|---|
| 11,245,131 B2 | 2/2022 | Tsujimura et al. |
| 2011/0262816 A1 | 10/2011 | Amatucci |
| 2016/0312006 A1 | 10/2016 | Badre et al. |
| 2017/0256820 A1 | 9/2017 | Matsumoto et al. |
| 2019/0051931 A1 | 2/2019 | Sung et al. |
| 2020/0235427 A1* | 7/2020 | Kim .................. H01M 4/624 |

FOREIGN PATENT DOCUMENTS

| | | | | |
|---|---|---|---|---|
| EP | 3 783 679 B1 | | 4/2024 | |
| JP | 2005251466 A | * | 9/2005 | .............. H01M 8/02 |
| JP | 2010111597 A | * | 5/2010 | |
| JP | 2016-129428 | | 7/2016 | |
| JP | 2018-065610 A | | 4/2018 | |
| KR | 10-2009-0004135 | | 1/2009 | |
| KR | 10-2012-0125498 | | 11/2012 | |
| KR | 10-2013-0114097 A | | 10/2013 | |
| KR | 10-2014-0046611 | | 4/2014 | |
| KR | 10-2016-0091981 | | 8/2016 | |
| KR | 10-2017-0046698 | | 5/2017 | |
| KR | 10-2017-0077014 A | | 7/2017 | |
| KR | 10-2019-0120725 A1 | | 10/2019 | |
| WO | 2015078551 | | 6/2015 | |
| WO | 2016031961 A1 | | 3/2016 | |
| WO | 2016090087 A1 | | 6/2016 | |
| WO | 2017123026 | | 7/2017 | |
| WO | 2019203549 | | 10/2019 | |
| WO | WO-2019188358 A1 | * | 10/2019 | ............ H01M 10/05 |

OTHER PUBLICATIONS

Hagiwara et al., "An ionic liquid with a fluorohydrogenate ion as a counter anion", Electrochemistry, vol. 81, No. 9, pp. 698-701 (2013).

Supplementary European Search Report and Written Opinion, Europe Patent Application 19788645 (Dec. 10, 2021) (7 pages).

International Search Report for International Application No. PCT/KR2019/004596 mailed Jul. 22, 2019, 5 pages.

Written Opinion for International Application No. PCT/KR2019/004596 mailed Jul. 22, 2019, 11 pages.

International Search Report for International Application No. PCT/KR2020/014077 mailed Jan. 18, 2021, 7 pages.

Written Opinion for International Application No. PCT/KR2020/014077 mailed Jan. 18, 2021, 8 pages.

Taniki et al., "Highly Conductive Plastic Crystals Based on Fluorohydrogenate Anions", J. Phys. Chem. B, 117, pp. 955-960 (dx.doi.org/10.1021/jp311558h) (2013).

Orita, A. et al. Application of sulfonium-, thiophenium-, and thioxonium-based salts as electric doublelayer capacitor electrolytes. Journal of Power Sources. 2010, vol. 195, No. 19, pp. 6970-6976.

Taniki, R. et al. Effects of HF content in the (FH)n F- anion on the formation of ionic plastic crystal phases of N-ethyl-N-methylpyrrolidinium and N, N-dimethylpyrrolidinium fluorohydrogenate salts. Physical Chemistry Chemical Physics. 2014, vol. 16, No. 4, pp. 1522-1528.

\* cited by examiner

[Figure 1]
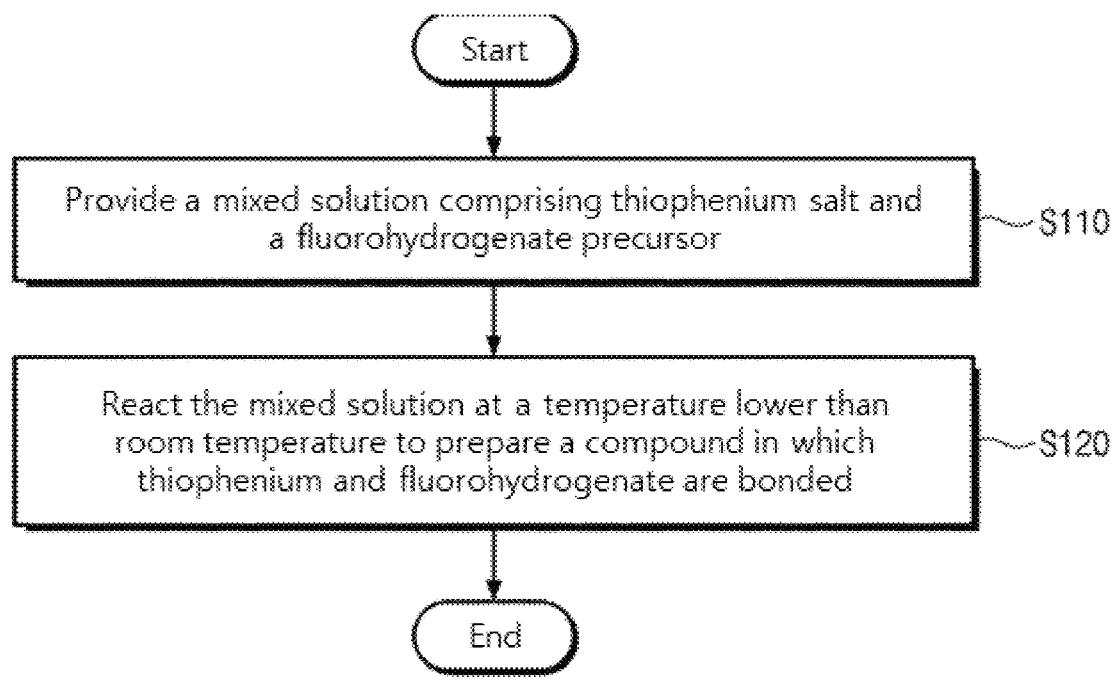

[Figure 2]
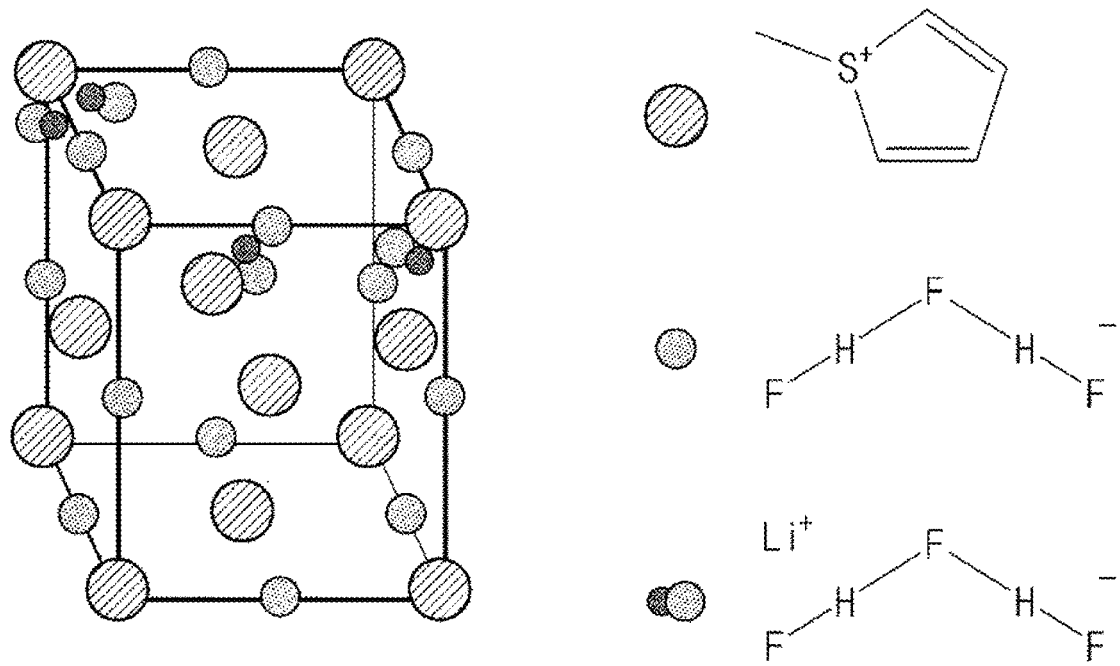
[Figure 3]
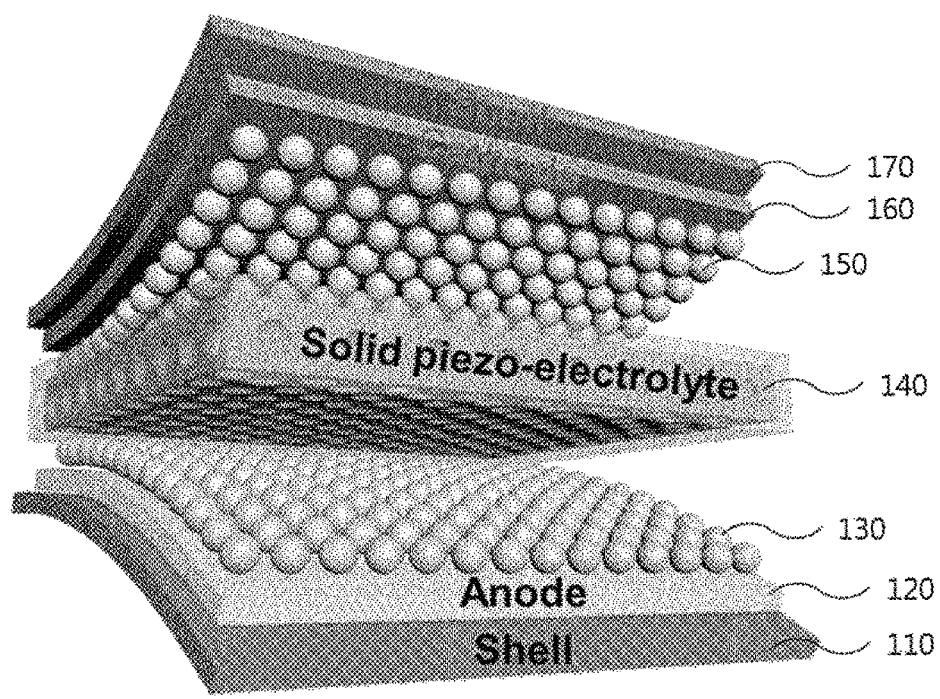

[Figure 4]
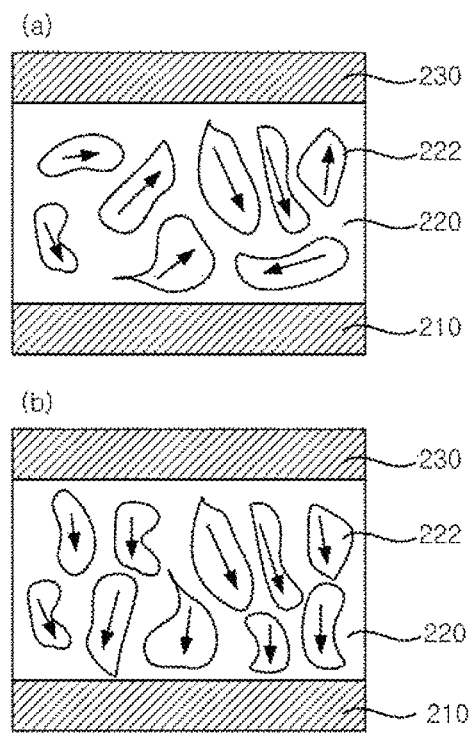
[Figure 5]
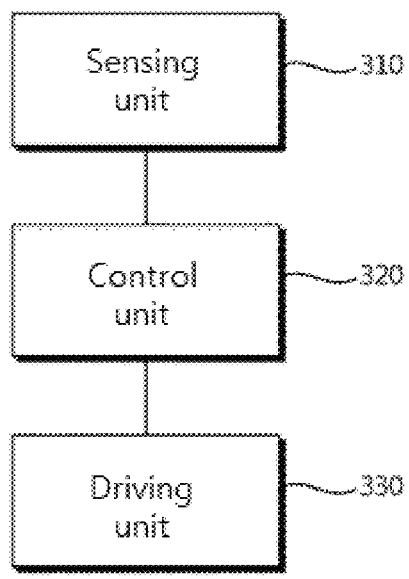

[Figure 6]
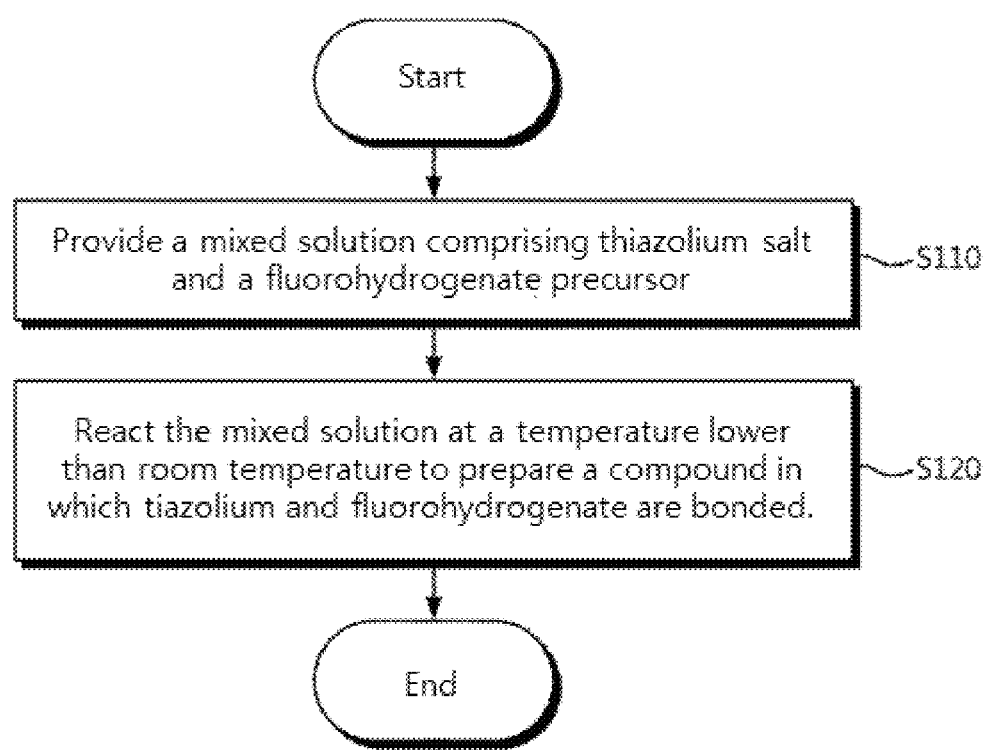

[Figure 7]
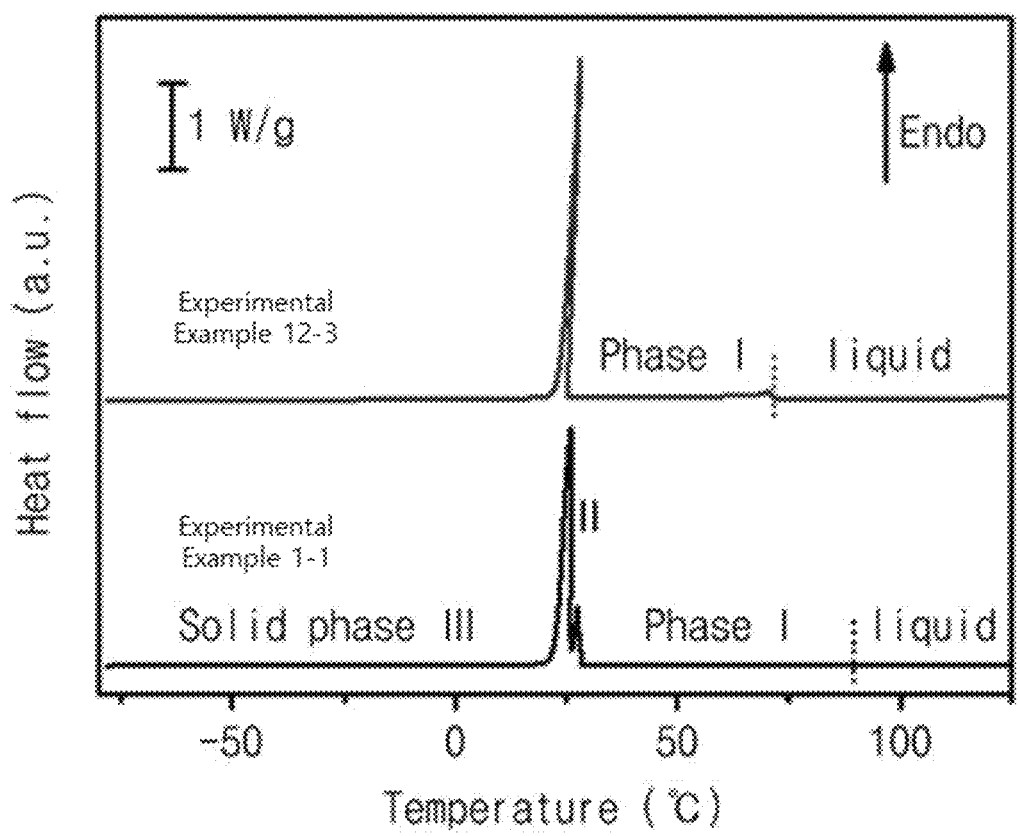

[Figure 8]
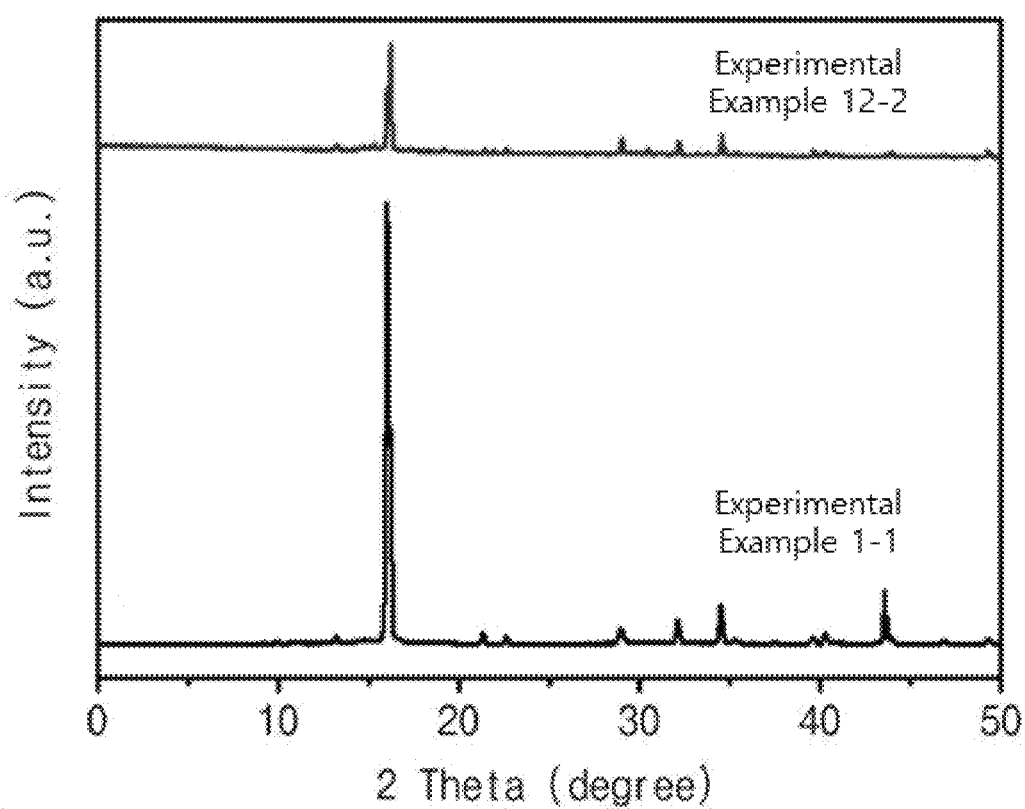

[Figure 9]
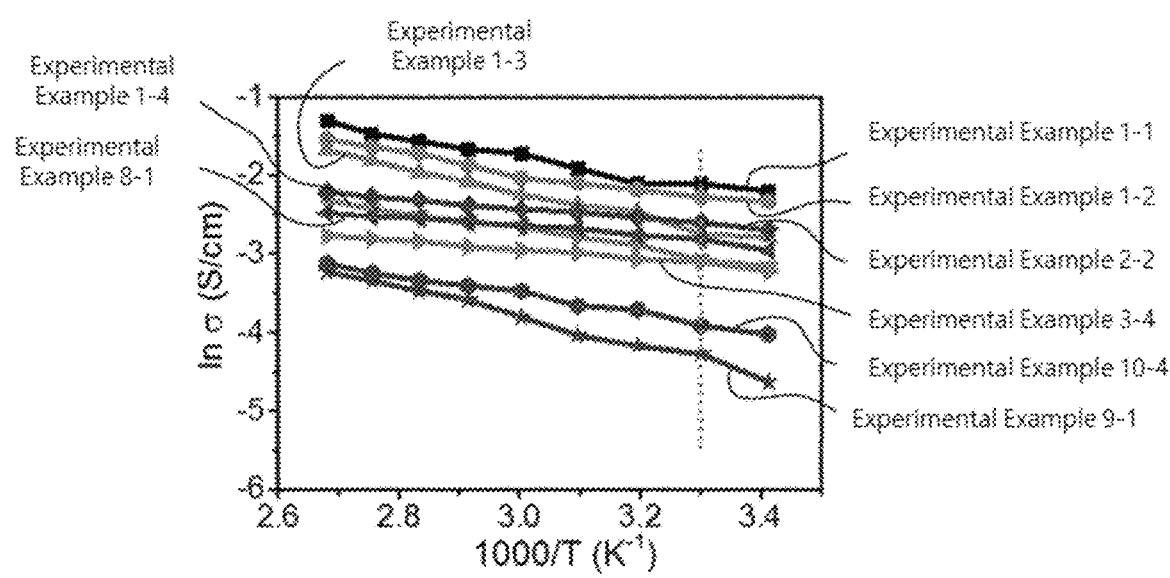

[Figure 10]
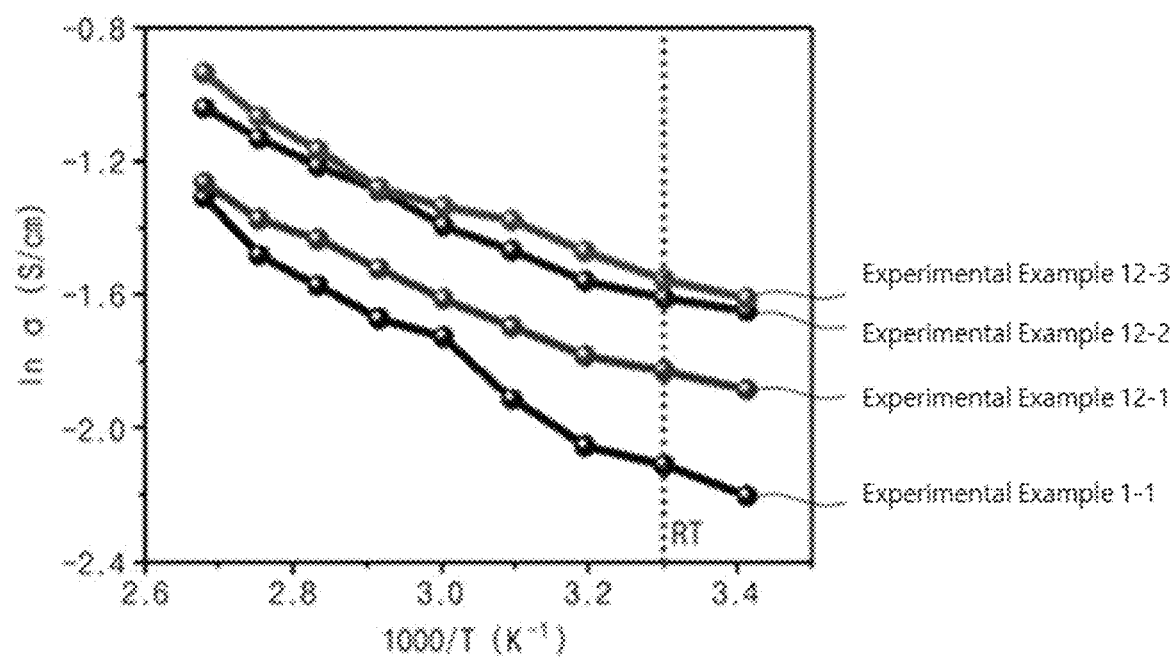
[Figure 11]
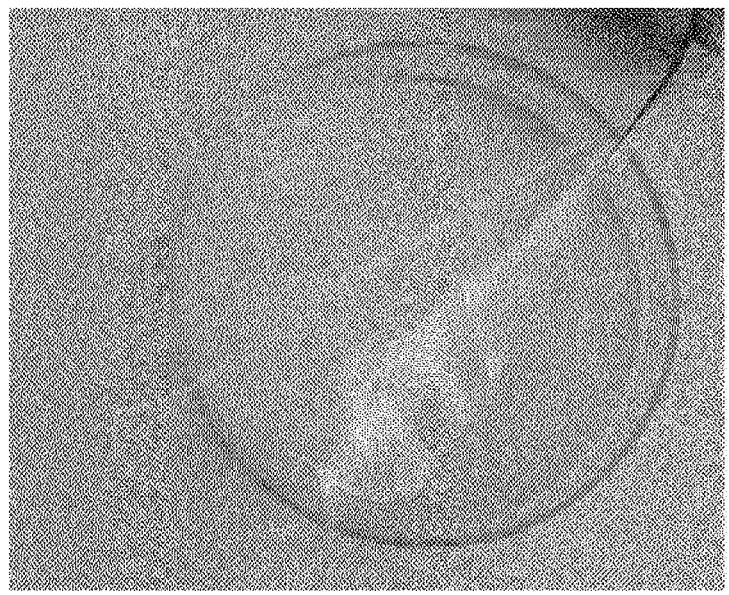

[Figure 12]
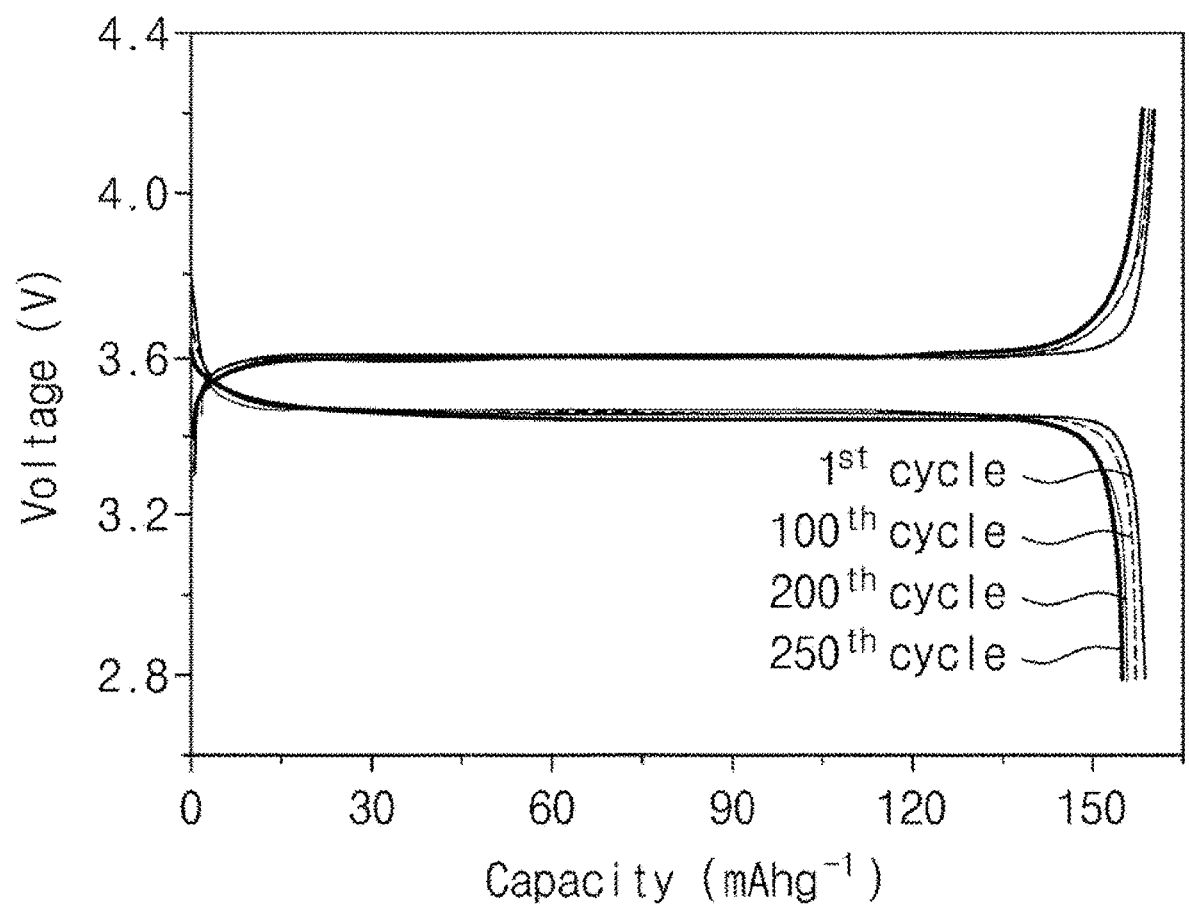

[Figure 13]
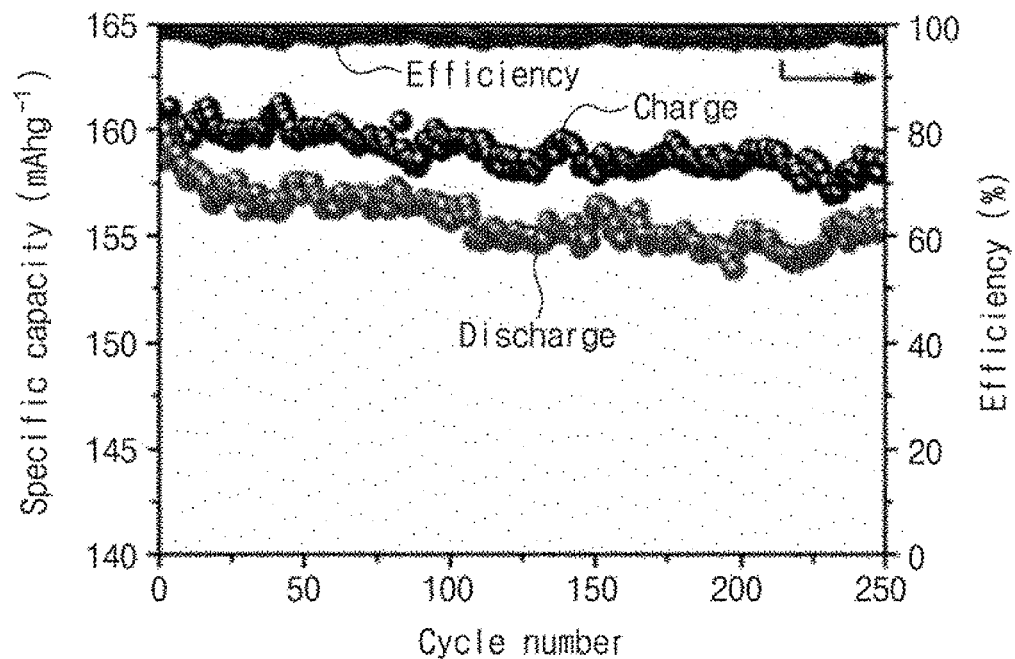
[Figure 14]
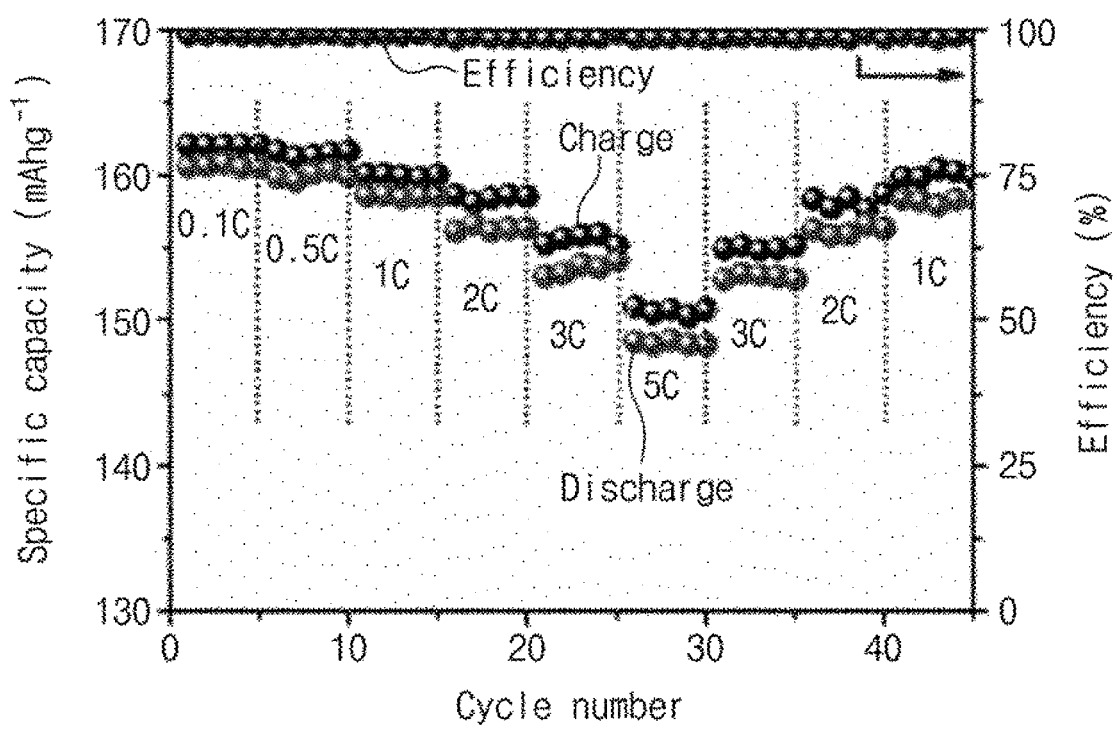

[Figure 15]
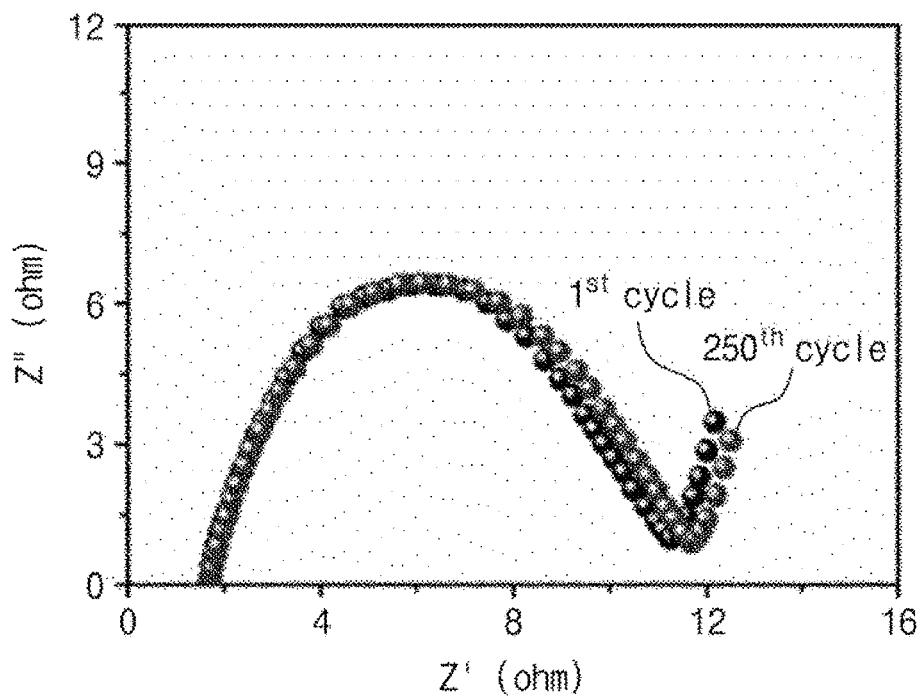
[Figure 16]
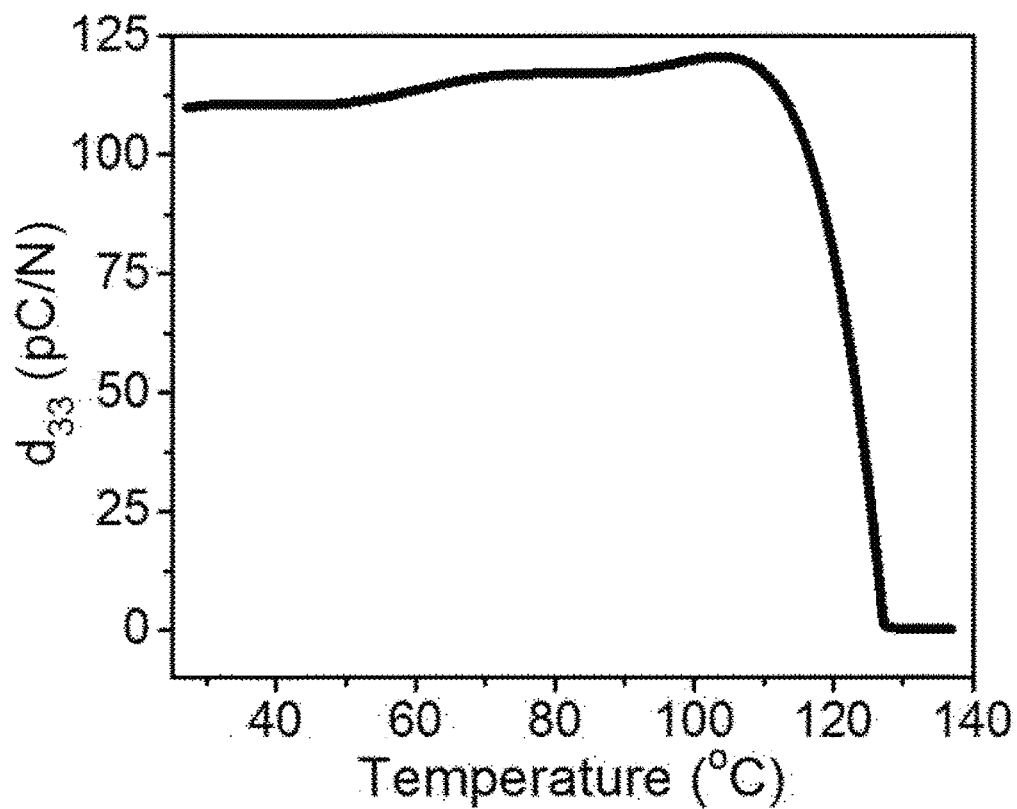

【Figure 17】
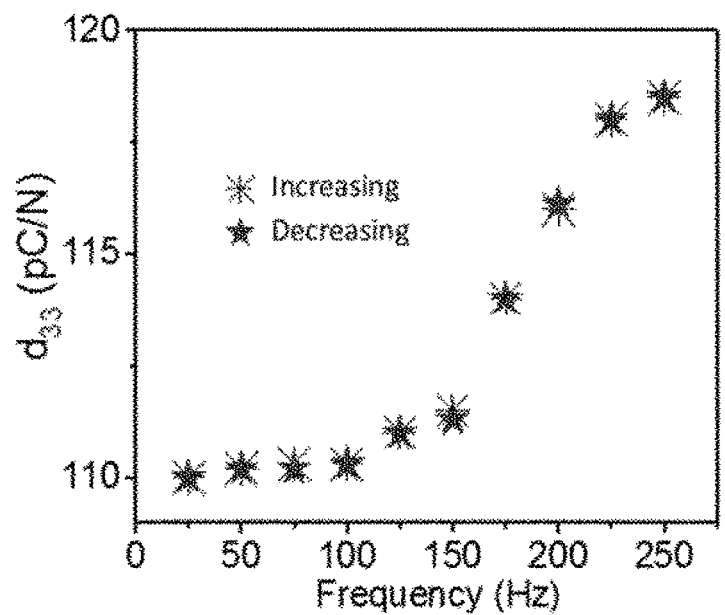
【Figure 18】
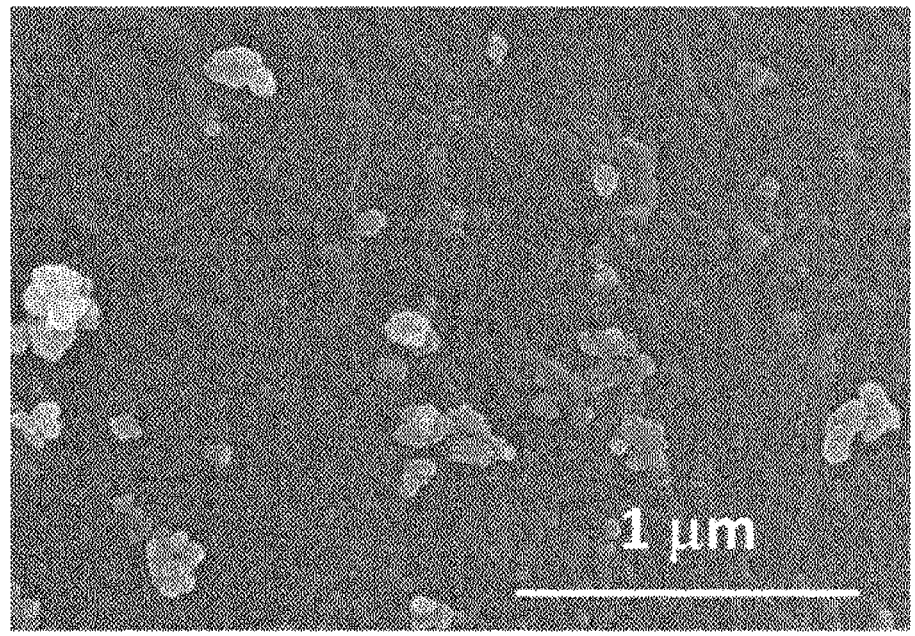

[Figure 19]
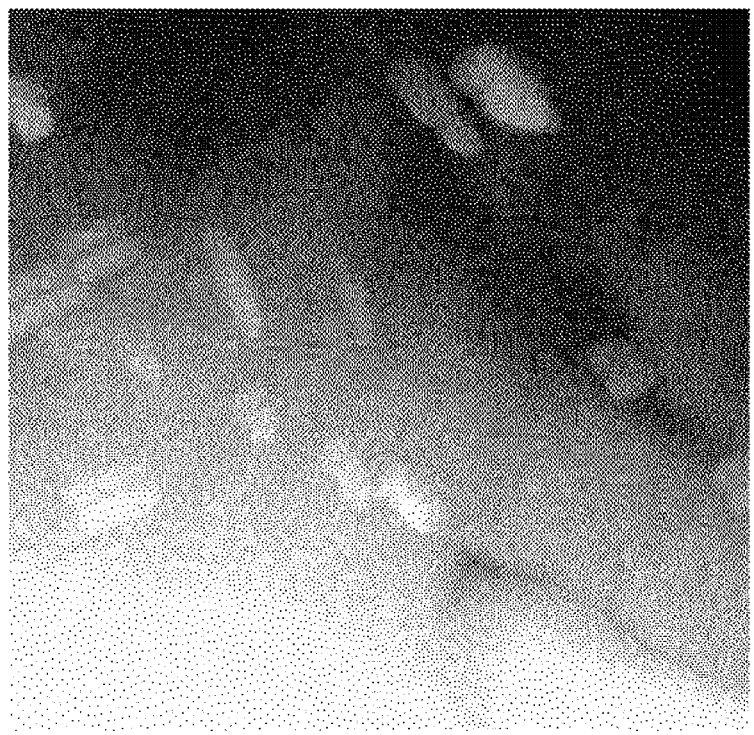
[Figure 20]
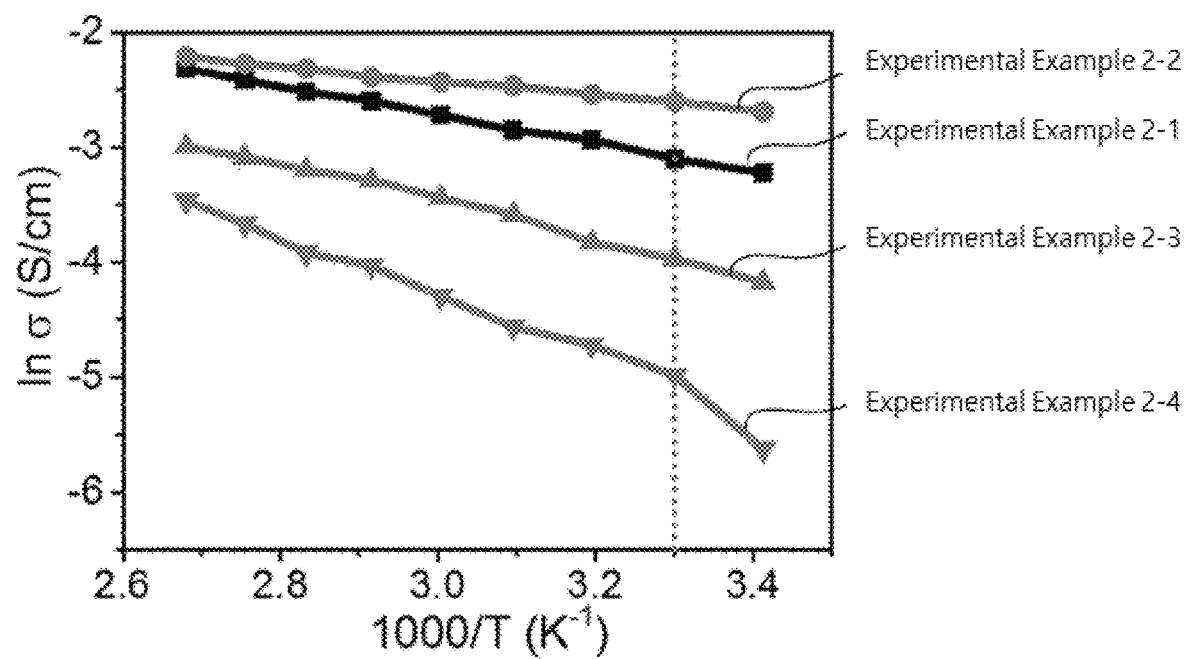

[Figure 21]
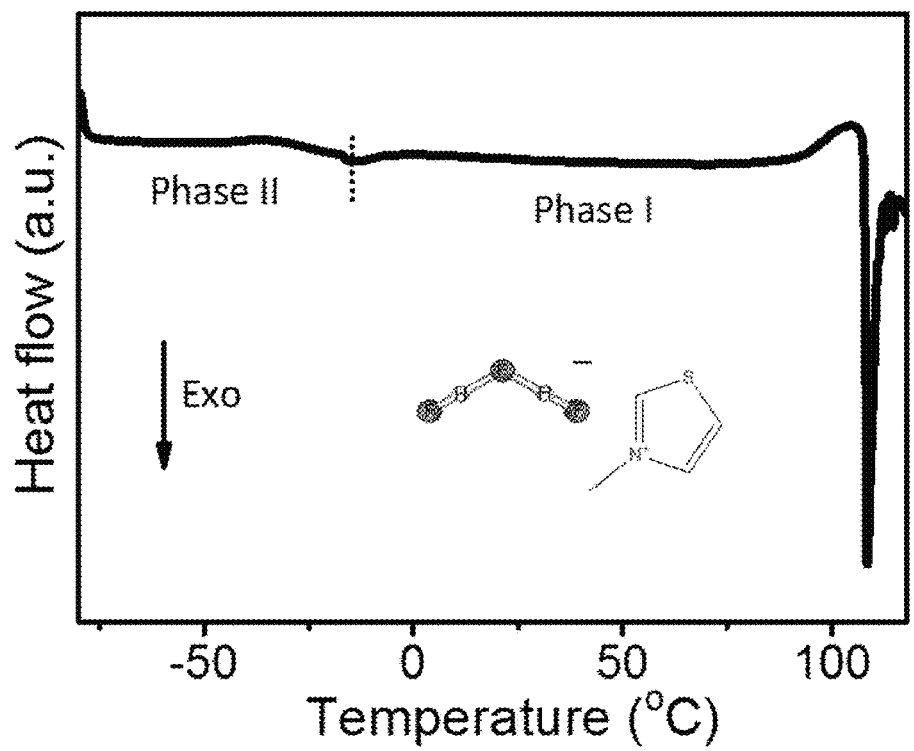
[Figure 22]
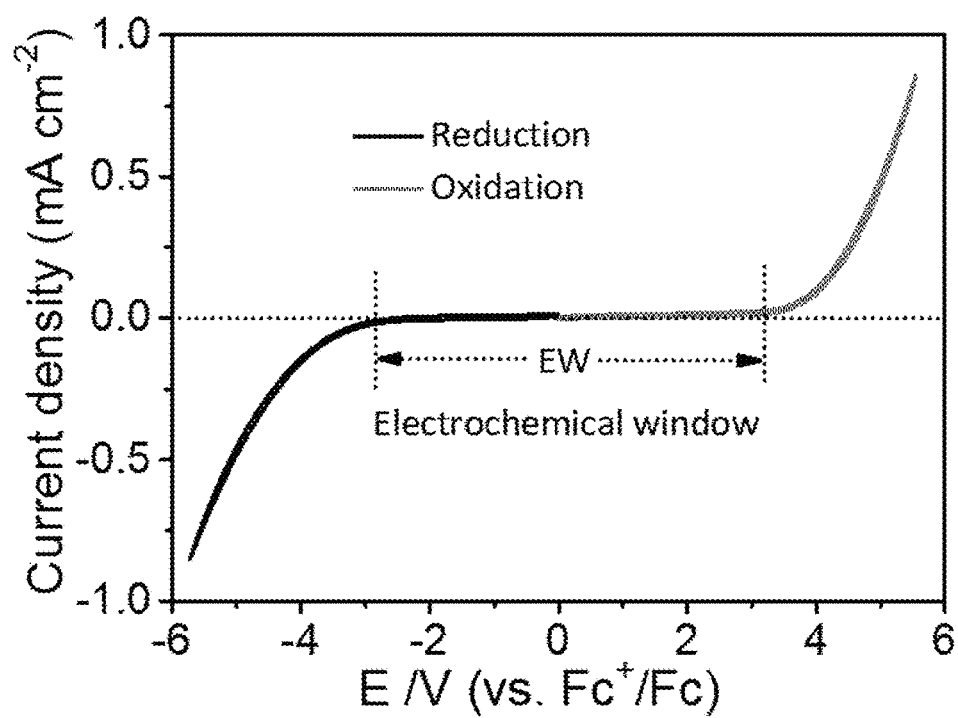

[Figure 23]
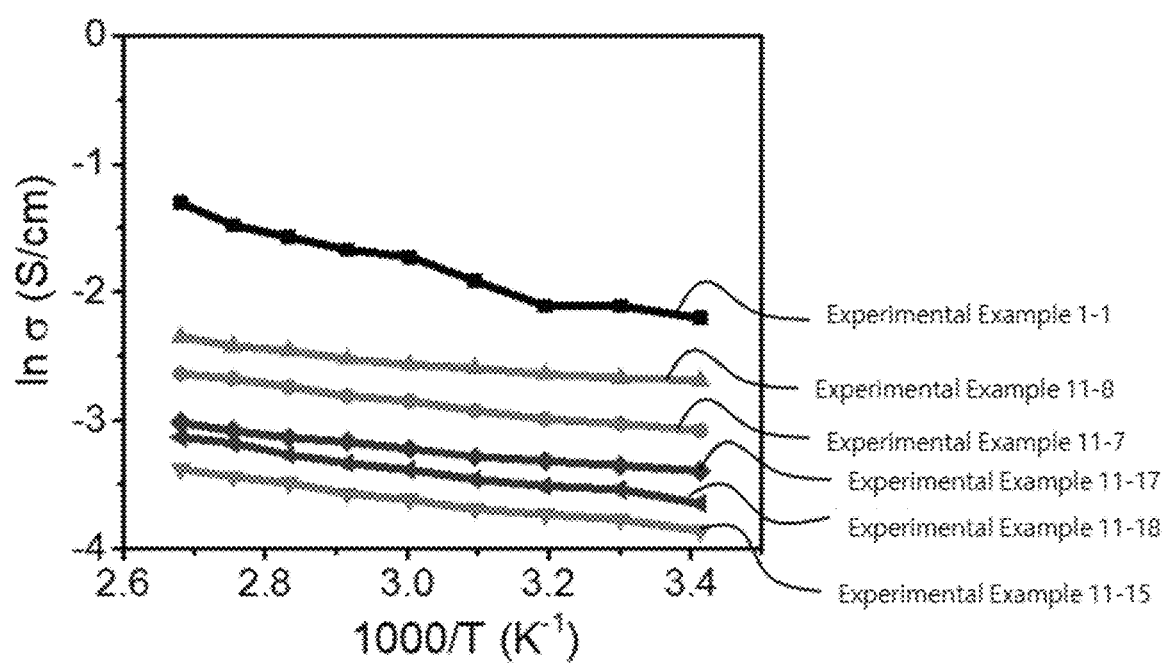

[Figure 24]
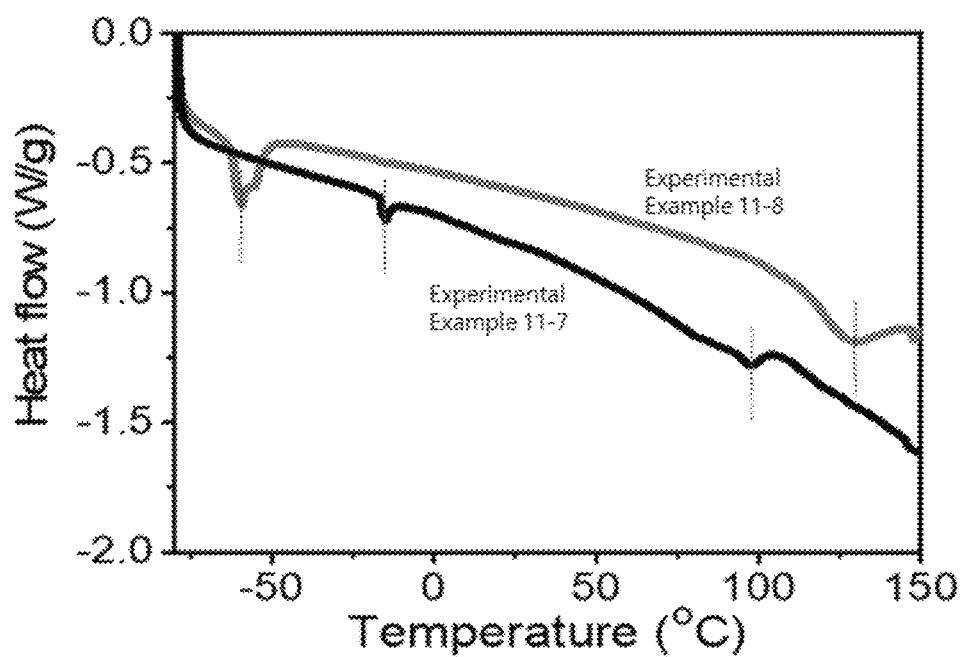

[Figure 25]
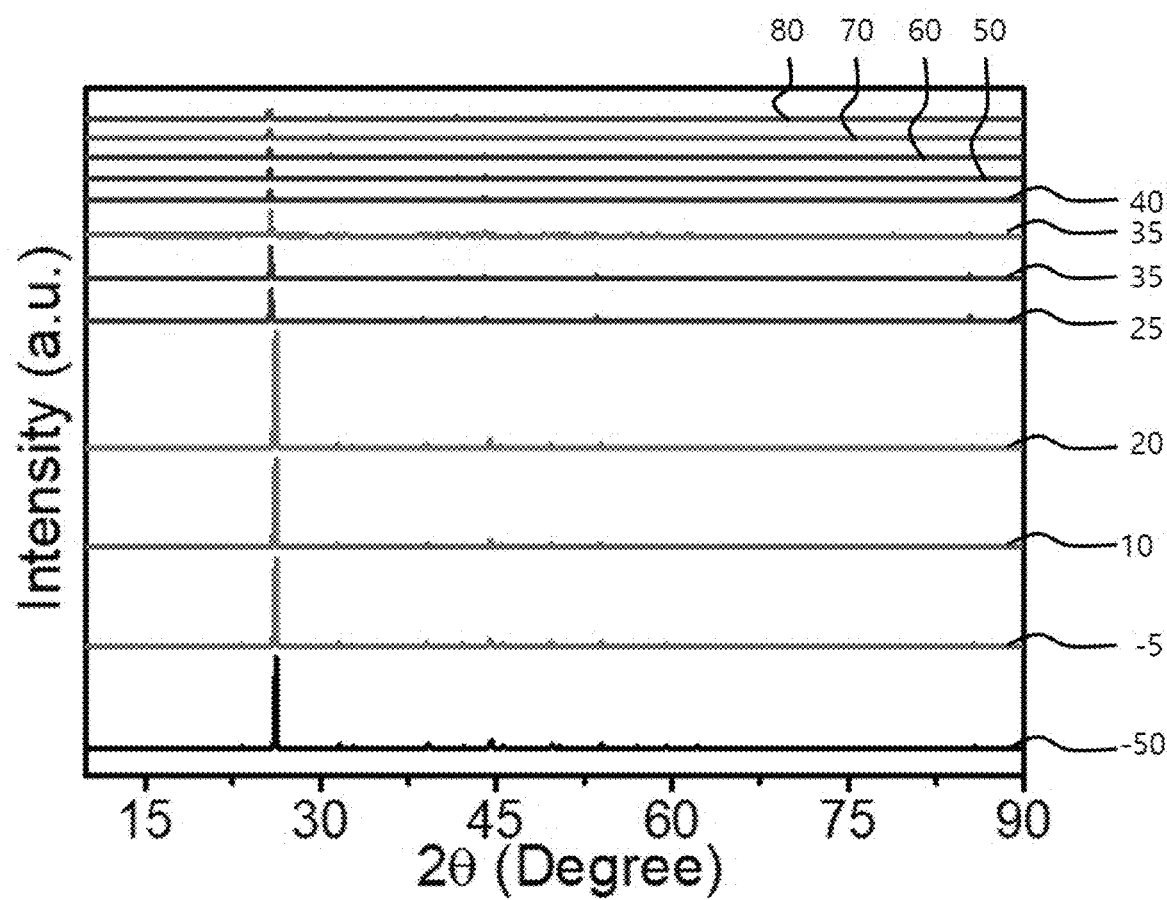

[Figure 26]
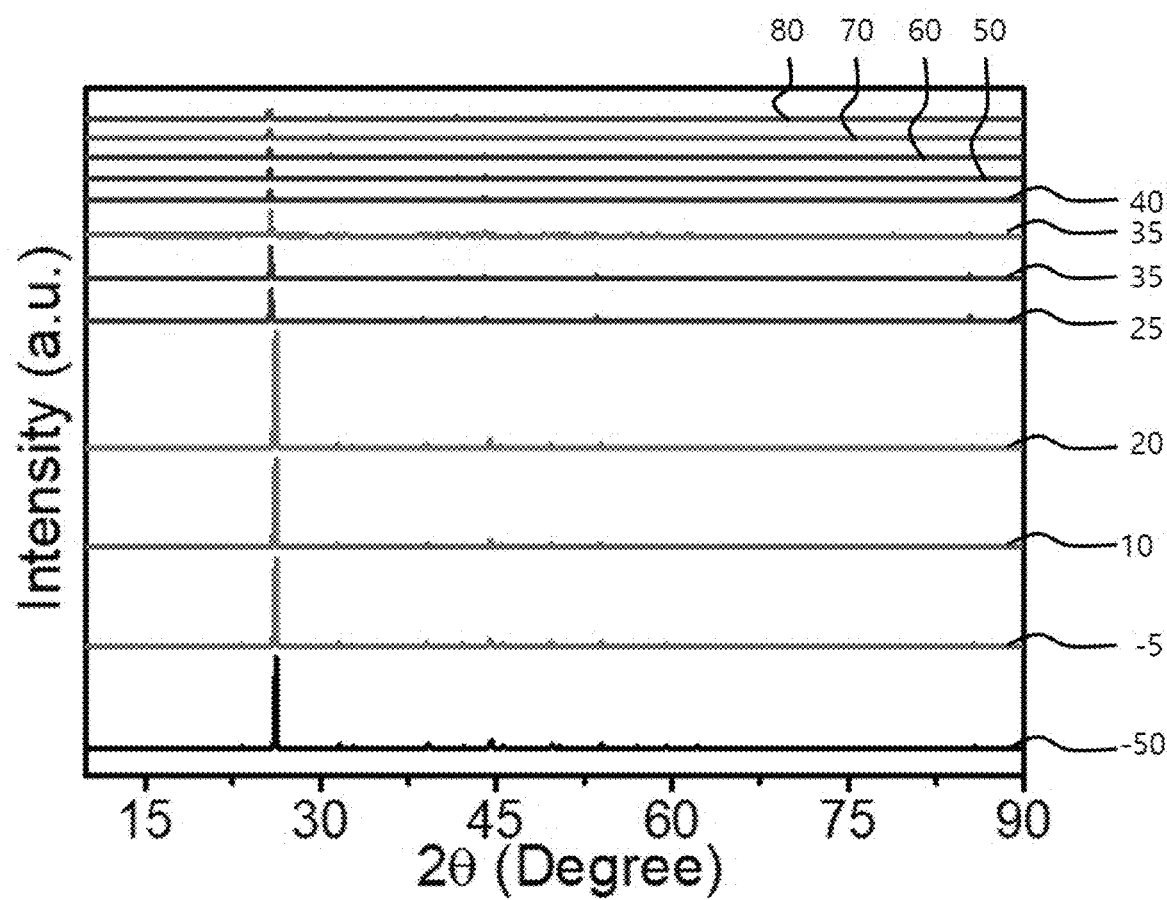

[Figure 27]
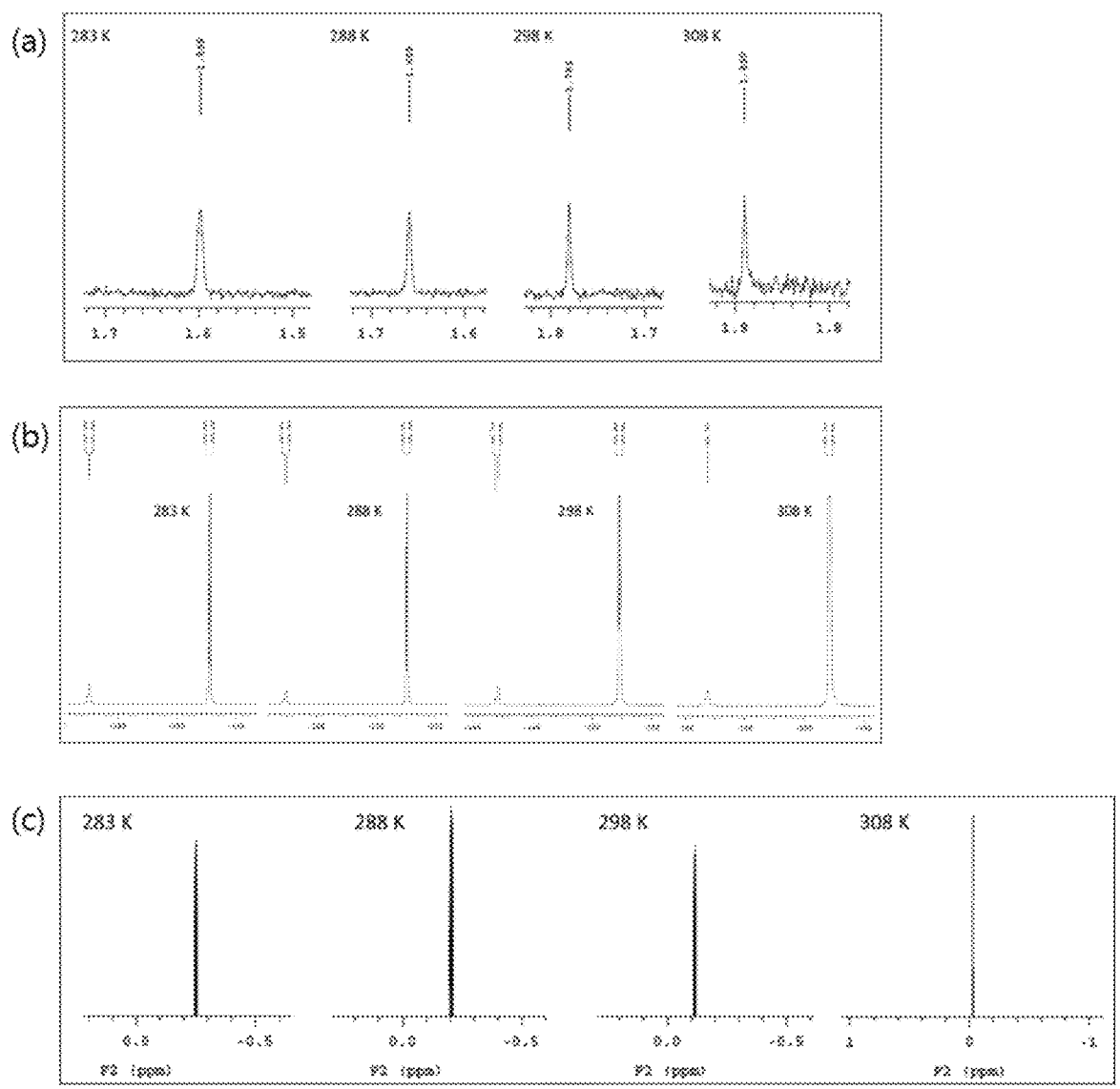

[Figure 28]
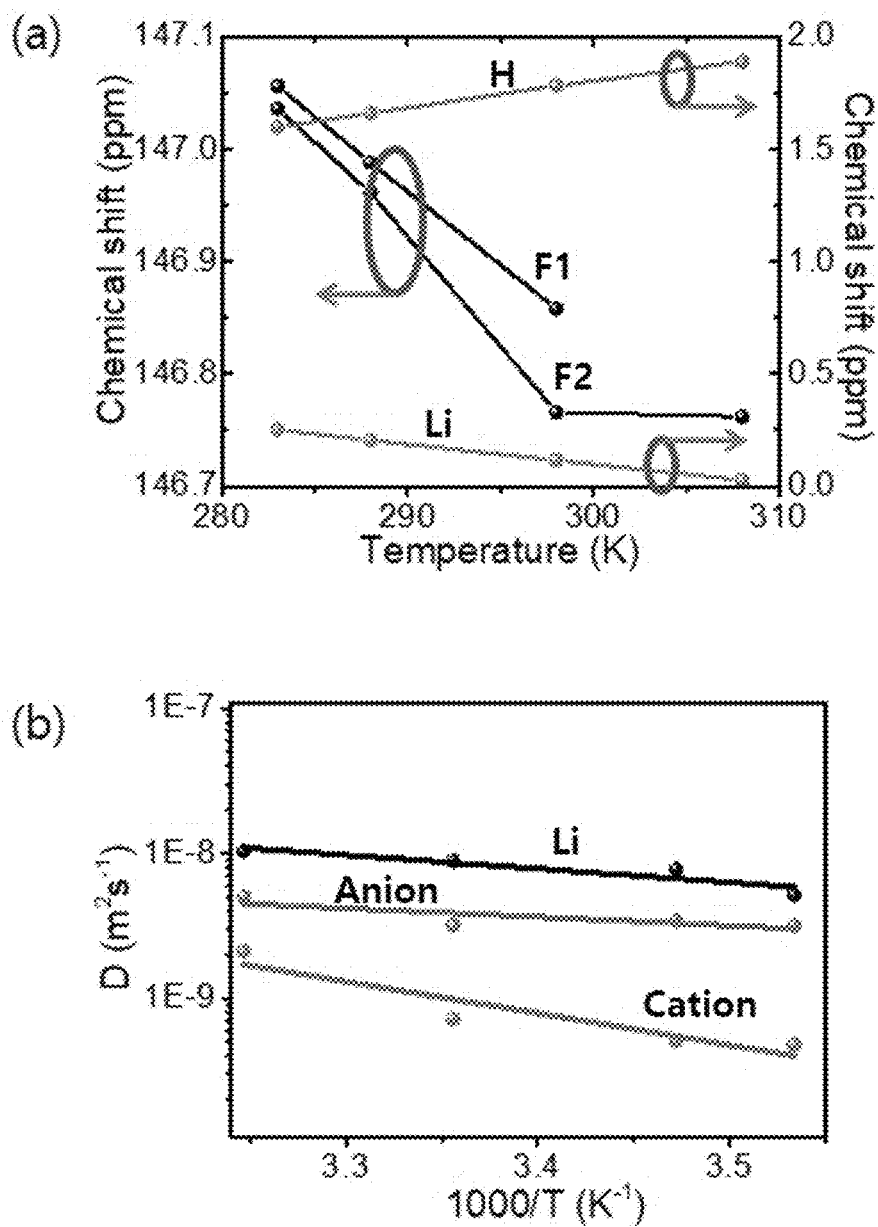

SOLID ELECTROLYTE, INTERMEDIATE OF SOLID ELECTROLYTE, SECONDARY BATTERY COMPRISING THE SAME, AND METHOD OF FABRICATING THE SAME

TECHNICAL FIELD

The present application relates to a solid electrolyte and a method for preparing the same and, more particularly, to a solid electrolyte including a compound in which cations and anions are bonded, an intermediate of solid electrolyte, secondary battery comprising the same, and methods fabricating of the same.

BACKGROUND ART

In general, a secondary battery includes a positive electrode, a negative electrode, and an electrolyte provided between the positive electrode and the negative electrode. The secondary battery is used in portable electronic devices such as smart phones. In the market for portable electronic devices, the electronic devices are being manufactured to have thin and flexible properties. Accordingly, there is a demand for smaller and lighter secondary batteries. Now, however, a liquid-based material, in which salt including ions such as lithium, sodium or the like is mixed in an organic solvent, is mainly used as an electrolyte for the secondary battery. In this case, with the use of the secondary battery, there is a problem in that the organic solvent of the electrolyte is likely to volatilize or leak, and there is also a risk of explosion due to swelling as a temperature rises. Accordingly, there is a growing need for a solid electrolyte with enhanced stability compared to a liquid electrolyte. In this case, the general solid electrolyte has a lower ion conductivity compared to the liquid electrolyte. To compensate for this defect, there has been an ongoing study on the solid electrolyte containing an ionic material.

For example, Korean Unexamined Patent Publication No. 10-2014-0046611 (application no. 10-2012-0111557) provides a composition for an ionic liquid polymer electrolyte, which contains an ionic liquid monomer having a vinyl group and an ionic group, an organic electrolyte, and a cross-linking agent having at least two double bonds at a terminal, in which the ionic group contains cations and anions. Accordingly, disclosed is a method for preparing a composition for an ionic liquid polymer electrolyte capable of solving the problem of electrolyte leakage and providing a lithium secondary battery having excellent flame-retardant properties.

DISCLOSURE

Technical Problem

One technical object of the present invention is to provide a solid electrolyte and a method for preparing the same.

Another technical object of the present invention is to provide a solid electrolyte including a compound in which cations and anions are bonded and which has a crystal phase, and a method for preparing the same.

Still another technical object of the present invention is to provide a solid electrolyte having a high ion conductivity, and a method for preparing the same.

Still another technical object of the present invention is to provide an organic piezoelectric material and a method for preparing the same.

Still another technical object of the present invention is to provide an intermediate product of a solid electrolyte having a high ion conductivity, the solid electrolyte using the same, a secondary battery including the same, and a method for preparing the same.

Still another technical object of the present invention is to provide a cation source and an anion source for preparing a solid electrolyte including a compound in which cations and anions are bonded.

Still another technical object of the present invention is to provide an organic piezoelectric material in which cations and anions are bonded and which has a crystal phase, and a method for preparing the same.

Still another technical object of the present invention is to provide an organic piezoelectric material having a high piezoelectric performance, and a method for preparing the same.

The technical objects of the present application are not limited to the above.

Technical Solution

To solve the above technical objects, the present application provides a solid electrolyte.

According to one embodiment, the solid electrolyte may include a compound in which cations having thiophenium and anions having fluorohydrogenate are bonded.

According to one embodiment, the compound may include an alkyl group bonded with a sulfur element of the thiophenium and the alkyl group may include one of a methyl group, an ethyl group, a propyl group or a butyl group.

According to one embodiment, the compound may have an ion conductivity that decreases as a chain of the alkyl group becomes longer.

According to one embodiment, the compound may include a methyl group bonded with a sulfur element of the thiophenium, and may have a first crystal phase in a temperature range of 28 to 90° C. and a second crystal phase in a temperature range of 22 to 28° C. in a heat flow spectrum according to temperature by differential scanning calorimetry (DSC).

According to one embodiment, the solid electrolyte may further include lithium salt, in which a unit cell of the compound may have an orthorhombic crystal structure, the cation may be provided at a vertex and at a center of a face of the crystal structure, the anion may be provided in a middle of an edge of the crystal structure, and the lithium salt may be arbitrarily provided at interstitial sites of the crystal structure.

According to one embodiment, an ion conductivity of the solid electrolyte may increase as a concentration of the lithium salt increases.

According to one embodiment, a methyl group bonded with a sulfur element of the thiophenium may be provided, and the solid electrolyte may have a crystal phase in a temperature range of 28 to 70° C. in a heat flow spectrum according to temperature by differential scanning calorimetry (DSC).

According to one embodiment, if an external force is applied, the cation and the anion may have a displacement, so that the compound may have piezoelectric properties.

To solve the above technical objects, the present application provides a self-generating secondary battery.

According to one embodiment, the self-generating secondary battery may include a positive electrode, a negative electrode, and an electrolyte positioned between the positive electrode and the negative electrode, in which the electrolyte may include the compound according to the above-described embodiment and lithium salt.

To solve the above technical objects, the present application provides a solid electrolyte.

According to one embodiment, the solid electrolyte may include a compound in which cations including thiophenium and anions including fluorohydrogenate are bonded.

According to one embodiment, the compound may include an alkyl group bonded with a nitrogen element of the thiazolium and the alkyl group may include one of a methyl group, an ethyl group, a propyl group or a butyl group.

According to one embodiment, the compound may include an ethyl group bonded with a nitrogen element of the thiazolium.

According to one embodiment, the solid electrolyte may further include lithium salt.

To solve the above technical objects, the present application provides a solid electrolyte.

According to one embodiment, the solid electrolyte may include a compound in which cations and anions are bonded, in which the cations and the anions may be selected to have a maximum ion conductivity in a range satisfying a condition allowing the compound to have a crystal phase.

According to one embodiment, the condition for allowing the compound to have the crystal phase may include a condition in which a molecular weight of the cation is 95 g/mol or more, a molecular weight of the anion is more than 60 g/mol, and a hydrogen ion concentration (pH) of the anion is less than 3, in which an entropy of fusion of the compound is 15-25 J/K mol so that the crystal phase of the compound has softness.

According to one embodiment, the cation may include a pentagonal heterocyclic compound, in which the heterocyclic compound may include one element of sulfur, nitrogen, oxygen or phosphorus.

According to one embodiment, if the cation includes thiophenium, the anion may include one of fluorohydrogenate, cyano(nitroso)methanide or tetrazoline.

To solve the above technical objects, the present application provides a method for preparing a solid electrolyte.

According to one embodiment, the method for preparing a solid electrolyte may include providing a mixed solution containing one of thiophenium salt or thiazolium salt, and a fluorohydrogenate precursor, and reacting the mixed solution at a temperature lower than room temperature to prepare a compound in which thiophenium and fluorohydrogenate are bonded, or a compound in which thiazolium and fluorohydrogenate are bonded.

According to one embodiment, the providing of the mixed solution may include preparing the thiophenium salt or the thiazolium salt, in which the preparing of the thiophenium salt or the thiazolium salt may include providing an alkyl group precursor solution, dripping thiophene or thiazoline into the alkyl group precursor solution to prepare a cation source solution, and reacting the cation source solution to prepare the thiophenium salt or the thiazolium salt containing the alkyl group, in which the alkyl group may include one of a methyl group, an ethyl group, a propyl group or a butyl group.

According to one embodiment, the providing of the mixed solution may include the preparing of the fluorohydrogenate precursor, in which the preparing of the fluorohydrogenate precursor may include stirring a solution containing hydrofluoric acid and water to prepare the fluorohydrogenate precursor.

According to one embodiment, the method for preparing a solid electrolyte may include providing lithium fluorohydrogenate, and mixing and heat-treating the compound according to the above-described embodiment and the lithium fluorohydrogenate to prepare a lithium-doped solid electrolyte, in which the providing of the lithium fluorohydrogenate may include adding lithium salt into hydrofluoric acid aqueous solution to prepare a source solution, and reacting the source solution at a temperature lower than room temperature to prepare the lithium fluorohydrogenate.

To solve the above technical objects, the present application may provide an intermediate product of a solid electrolyte.

According to one embodiment, the intermediate product of the solid electrolyte may include a compound in which cations including thiophenium or thiazolium and anions including fluorohydrogenate are bonded, and a solvent mixed with the compound.

According to one embodiment, the intermediate product of the solid electrolyte including the compound and the solvent may be in a liquid or gel state.

According to one embodiment, the solvent may include at least one of acetonitrile, tetrahydrofuran, DMSO, or DMF.

According to one embodiment, the cation may include the thiophenium and the compound may include a methyl group bonded with a sulfur element of the thiophenium.

According to one embodiment, the cation may include the thiazolium and the compound may include an ethyl group bonded with a nitrogen element of the thiazolium.

To solve the above technical objects, the present application may provide a method for preparing a solid electrolyte.

According to one embodiment, the method for preparing a solid electrolyte may include providing an intermediate product of a solid electrolyte according to the above-described embodiments, and removing and drying the solvent included in the intermediate product of the solid electrolyte to prepare a solid electrolyte.

To solve the above technical objects, the present application may provide a secondary battery.

According to one embodiment, the secondary battery may include a positive electrode, a solid electrolyte disposed on the positive electrode and prepared according to the above-described embodiment, and a negative electrode disposed on the solid electrolyte.

According to one embodiment, a positive electrode active material of the positive electrode may include lithium, phosphorus, and iron, and a negative electrode active material of the negative electrode may include lithium.

To solve the above technical objects, the present application may provide a cation source for preparing a solid electrolyte.

According to one embodiment, the cation source for preparing the solid electrolyte may be intended for preparing a solid electrolyte including a compound in which cations and anions are bonded, and may include a solution containing an alkyl group, and thiophene or thiazolin mixed in the solution containing the alkyl group.

According to one embodiment, thiophene may be mixed in the solution containing the alkyl group, and the solution containing the alkyl group may contain dichloromethane and acetonitrile.

According to one embodiment, thiazoline may be mixed in the solution containing the alkyl group, and the solution containing the alkyl group may contain ethyl chloride and acetonitrile.

To solve the above technical objects, the present application may provide an anion source for preparing a solid electrolyte.

According to one embodiment, the anion source for preparing the solid electrolyte may be intended for preparing a solid electrolyte including a compound in which cations and anions are bonded, and may include a solvent including water, and hydrofluoric acid mixed in the solvent.

According to one embodiment, the anion source may further include lithium salt in addition to the solvent and the hydrofluoric acid.

Advantageous Effects

According to an embodiment of the present invention, the solid electrolyte may include a compound in which cations having thiophenium and anions having fluorohydrogenate are bonded.

In addition, the solid electrolyte may include the compound and lithium salt. In this case, a unit cell of the compound may have an orthorhombic crystal structure, in which the thiophenium may be provided at a vertex and at a center of a face of the crystal structure, and the fluorohydrogenate may be provided in a middle of an edge of the crystal structure. Accordingly, the solid electrolyte may have the lithium salt arbitrarily provided at interstitial sites of the crystal structure.

As described above, the lithium salt may easily move within the crystal structure. Accordingly, the solid electrolyte may have an ion conductivity that becomes higher as a concentration of the lithium salt increases.

In addition, as described above, the solid electrolyte may have a lithium-enriched phase formed. In this case, the lithium-enriched phase may have a relatively low melting point. In other words, the solid electrolyte may have a melting point lower than that of the compound, and thus an entropy of fusion of the solid electrolyte may decrease.

Thus, the solid electrolyte may include the compound in which the cations and the anions are bonded, but may have a crystal phase and a high ion conductivity. Accordingly, the solid electrolyte may be easily provided as an electrolyte for a secondary battery.

The compound, in which the cations including the thiophenium and the anions including the fluorohydrogenate are bonded, may include an organic piezoelectric material. In this case, the organic piezoelectric material may have a crystal structure. If an external force is applied to the organic piezoelectric material, the cations and the anions in a unit cell of the crystal structure may have a displacement, and thus the organic piezoelectric material may have piezoelectric properties.

The organic piezoelectric material may have an entropy of fusion of 15-35 J/K mol. Accordingly, the crystal structure of the organic piezoelectric material may have softness. In addition, the organic piezoelectric material may include a polycrystal having a plurality of microcrystals. Accordingly, the organic piezoelectric material may have piezoelectric properties caused by a spontaneous ionic polarization phenomenon. In this case, the organic piezoelectric material may have a high piezoelectric coefficient of 109 pC/N at room temperature. In addition, the organic piezoelectric material may be prepared at a temperature equal to or lower than room temperature.

Accordingly, the organic piezoelectric material may be prepared at a lower process temperature compared to a conventional inorganic piezoelectric material and through poling at a relatively low voltage. Accordingly, it may be possible to save time and costs required in a process of preparing the organic piezoelectric material. In addition, the organic piezoelectric material may have a higher piezoelectric coefficient compared to a conventional piezoelectric material, and thus can be easily used in various electronic elements such as a self-generating secondary battery, a piezoelectric sensor, a piezoelectric actuator, etc.

In addition, according to an embodiment of the present invention, the solid electrolyte may include a compound in which cations having thiazolium and anions having fluorohydrogenate are bonded. Furthermore, the solid electrolyte may include the compound and lithium salt. The solid electrolyte may have a crystal phase and a high ion conductivity.

According to an embodiment of the present application, there may be provided an intermediate product of a solid electrolyte including a compound in which cations including thiophenium or thiazolium and anions including fluorohydrogenate are bonded, as well as a solvent mixed with the compound.

In addition, according to an embodiment of the present application, there may be provided a cation source for preparing a solid electrolyte including a solution containing an alkyl group, and thiophene or thiazolin mixed in the solution containing the alkyl group, and an anion source for preparing a solid electrolyte including a solvent including water, and hydrofluoric acid mixed in the solvent.

An intermediate product of the solid electrolyte may be provided in a liquid or gel state, and the cation source and the anion source for preparing the solid electrolyte may be provided in a liquid state. Thus, compared to those provided in a solid state, the intermediate product of the solid electrolyte, the cation source, and the anion source can be easily stored, distributed, and transported. Accordingly, the cost for preparing the solid electrolyte can be saved, and mass production of the solid electrolyte can be facilitated.

DESCRIPTION OF DRAWINGS

FIG. 1 is a flowchart for explaining a method for preparing a solid electrolyte according to a first embodiment of the present invention.

FIG. 2 is a view showing a crystal structure of a solid electrolyte according to a first embodiment of the present invention.

FIG. 3 is a schematic view showing a self-generating secondary battery including an organic piezoelectric material according to an embodiment of the present invention.

FIG. 4 shows sectional views of a piezoelectric sensor including an organic piezoelectric material according to an embodiment of the present invention, which represents a driving principle.

FIG. 5 is a block view showing a device including an organic piezoelectric material according to an embodiment of the present invention.

FIG. 6 is a flowchart for explaining a method for preparing a solid electrolyte according to a second embodiment of the present invention.

FIG. 7 is a differential scanning calorimetry (DSC) graph showing a compound according to Experimental Example 1-1 and a solid electrolyte according to Experimental Example 2-3 of the present invention.

FIG. 8 is a graph showing an X-ray diffraction pattern (XRD) of a compound according to Experimental Example 1-1 and a solid electrolyte according to Experimental Example 2-2 of the present invention.

FIG. 9 is a graph showing an ion conductivity according to a temperature of compounds according to Experimental Examples 1-1 to 1-4 and compounds according to Experimental Examples 2-2, Experimental Examples 3-4, Experimental Examples 8-1, Experimental Examples 9-1, Experimental Examples 10-4 the present invention.

FIG. 10 is a graph showing an ion conductivity according to a temperature of a compound according to Experimental Example 1-1 and solid electrolytes according to Experimental Examples 2-1 to 2-3 of the present invention.

FIG. 11 is a view showing pictures of an electrolyte membrane coated with a solid electrolyte according to an embodiment of the present invention.

FIGS. 12 and 13 are graphs showing results of a cycle test of a secondary battery including a solid electrolyte according to Experimental Example 2-2 of the present invention.

FIG. 14 is a graph showing a capacity retention rate according to charge/discharge rate of a secondary battery including a solid electrolyte according to Experimental Example 2-2 of the present invention.

FIG. 15 is a graph showing an impedance according to a cycle test of a secondary battery including a solid electrolyte according to Experimental Example 2-2 of the present invention.

FIG. 16 is a graph showing a piezoelectric coefficient according to a temperature of an organic piezoelectric material according to an embodiment of the present invention.

FIG. 17 is a graph showing a piezoelectric coefficient according to a frequency of an organic piezoelectric material according to an embodiment of the present invention.

FIG. 18 is a scanning electron microscopy (SEM) image of an organic piezoelectric material according to an embodiment of the present invention.

FIG. 19 is a piezoresponse force microscopy (PFM) image of an organic piezoelectric material according to an embodiment of the present invention.

FIG. 20 is a graph showing a measured ion conductivity of a compound according to Experimental Examples 2-1 to 2-4 of the present invention.

FIG. 21 is a differential scanning calorimetry (DSC) graph of a compound according to Experimental Example 2-1 of the present invention.

FIG. 22 is a graph showing a measured electrochemical window of a compound according to Experimental Example 2-1 of the present invention.

FIG. 23 is a graph showing an ion conductivity measured according to a temperature of compounds according to Experimental Examples 1-1, 11-7, 11-8, 11-15, 11-17 and 11-18 of the present application.

FIG. 24 is a differential scanning calorimetry (DSC) graph showing a compound according to Experimental Examples 11-7 and 11-8 of the present application.

FIGS. 25 and 26 are graphs showing an X-ray diffraction pattern (XRD) according to a temperature of a compound according to Experimental Example 1-1 of the present application.

FIG. 27 is a graph showing an NMR analysis result of a solid electrolyte according to Experimental Example 12-1 of the present application.

FIG. 28 is a graph showing a chemical shift and a chemical diffusion measured according to a temperature of a solid electrolyte according to Experimental Example 12-1 of the present application.

MODE FOR INVENTION

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combinations thereof described in the specification are present, and are not to be understood as excluding the possibility that one or more other features, numbers, steps, elements, or combinations thereof may be present or added.

Further, in the following description of the present invention, a detailed description of known functions and configurations incorporated herein will be omitted when it may make the subject matter of the present invention unnecessarily unclear.

FIG. 1 is a flowchart for explaining a method for preparing a solid electrolyte according to a first embodiment of the present invention.

Referring to FIG. 1, a mixed solution including thiophenium salt and a fluorohydrogenate precursor may be provided (S110).

According to one embodiment, the thiophenium salt may be prepared by reacting an alkyl group precursor solution and thiophene.

In this case, the alkyl group precursor solution may be prepared by adding an alkyl group precursor material into a solvent and stirring at room temperature. For example, the solvent may include acetonitrile. Specifically, for example, the alkyl group precursor material may include one of dichloromethane represented by a following <Chemical Formula 1>, ethyl chloride represented by a following <Chemical Formula 2>, propyl chloride represented by a following <Chemical Formula 3>, or butyl chloride represented by a following <Chemical Formula 4>.

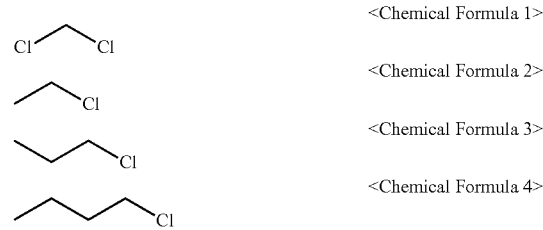

The thiophenium salt may be prepared by dripping the thiophene into the alkyl group precursor solution prepared as described above, and reacting the resulting solution. Unlike the above, if a large amount of the thiophene is added into the alkyl group precursor solution at one time, the reactivity between the thiophene and the alkyl group precursor material may decrease, and thus it may not be easy to prepare the thiophenium salt.

Thus, as described above, if the thiophene is dripped into the alkyl group precursor solution, the reactivity between the thiophene and the alkyl group precursor material may be enhanced. In other words, a yield of the thiophenium salt may be enhanced.

In this case, as a length of a chain of the alkyl group precursor material increases, a time of the reaction may increase. Accordingly, as the length of the chain increases, a temperature of the reaction may increase, and thus the reactivity between the alkyl group precursor material and the thiophene may be enhanced.

Accordingly, the thiophenium salt may include an alkyl group bonded with a sulfur atom of the thiophenium. For example, the thiophenium salt may include thiophenium chloride containing at least one of a methyl group, an ethyl group, a propyl group or a butyl group.

Specifically, for example, if the alkyl group precursor solution includes dichloromethane represented by the above <Chemical Formula 1>, the thiophene may be dripped into the solution containing the dichloromethane, and reacted at room temperature to prepare the thiophenium salt in which a carbon element of the dichloromethane is bonded with a sulfur element of the thiophene. In other words, the thiophenium salt containing a methyl group represented by a following <Chemical Formula 5> may be prepared.

<Chemical Formula 5>

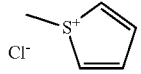

As another example, if the alkyl group precursor solution includes ethyl chloride represented by the above <Chemical Formula 2>, the thiophene may be dripped into the solution containing the ethyl chloride, and reacted at a temperature higher than room temperature to prepare the thiophenium salt in which the ethyl chloride is bonded with a sulfur element at 1-position of the thiophene. In other words, the thiophenium salt containing an ethyl group represented by a following <Chemical Formula 6> may be prepared.

<Chemical Formula 6>

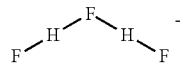

As still another example, if the alkyl group precursor solution includes propyl chloride represented by the above <Chemical Formula 3>, the thiophene may be dripped into the solution containing the propyl chloride, and reacted at a temperature higher than room temperature to prepare the thiophenium salt in which the propyl chloride is bonded with a sulfur element at 1-position of the thiophene. In other words, the thiophenium salt containing a propyl group represented by a following <Chemical Formula 7> may be prepared.

<Chemical Formula 7>

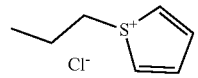

As still another example, if the alkyl group precursor solution includes butyl chloride represented by the above <Chemical Formula 4>, the thiophene may be dripped into the solution containing the butyl chloride, and reacted at a temperature higher than room temperature to prepare the thiophenium salt in which the butyl chloride is bonded with a sulfur element at 1-position of the thiophene. In other words, the thiophenium salt containing a butyl group represented by a following <Chemical Formula 8> may be prepared.

<Chemical Formula 6>

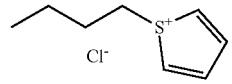

The fluorohydrogenate precursor may be prepared by stirring a solution containing hydrofluoric acid and water. Specifically, for example, the fluorohydrogenate precursor may be prepared by adding and stirring extra water into hydrofluoric acid at a concentration of 1M.

The mixed solution may be reacted to prepare a compound in which thiophenium and fluorohydrogenate are bonded (S120).

Specifically, for example, the mixed solution may be reacted at a temperature of −70° C. or less for 24 hours so as to prepare the compound in which the thiophenium and the fluorohydrogenate represented by a following <Chemical Formula 9> are bonded.

<Chemcial Formula 9>

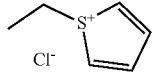

Unlike the above, if the mixed solution is reacted at room temperature, the fluorohydrogenate precursor may be evaporated. Specifically, the fluorohydrogenate precursor may have a boiling point at a temperature equal to or less than room temperature, and thus may be volatilized at room temperature.

Thus, as described above, if the mixed solution is reacted at a temperature of −70° C., the compound may be easily prepared. In addition, as a temperature of the reaction decreases, a loss of the fluorohydrogenate may decrease, and thus a time of the reaction may decrease.

As described above, the compound may include the alkyl group bonded to a sulfur element of the thiophenium. In this case, as a chain of the alkyl group becomes longer, a molecular weight of the thiophenium may increase. Accordingly, an ion conductivity of the compound may decrease. Specifically, for example, if the alkyl group is a methyl group, the compound may have a relatively high ion conductivity, and if the alkyl group is a butyl group, the compound may have a relatively low ion conductivity.

As described above, the compound may be composed of cations having the thiophenium and anions having the fluorohydrogenate and bonded to the cations. In addition, the compound may have a crystal phase.

Specifically, the compound may have a first crystal phase and a second crystal phase depending on a temperature. For example, the first crystal phase may be formed in a temperature range of 28 to 90° C., and the second crystal phase may be formed in a temperature range of 22 to 28° C. In this case, the compound may be subject to a solid-liquid state change at a temperature of 90° C. or higher.

FIG. 2 is a view showing a crystal structure of a solid electrolyte according to an embodiment of the present invention.

Referring to FIG. 2, a solid electrolyte including the compound and lithium salt may be prepared. As shown in FIG. 2, a unit cell of the compound may have an orthorhombic crystal structure, in which the thiophenium may be provided at a vertex and at a center of a face of the crystal structure, and the fluorohydrogenate may be provided in a middle of an edge of the crystal structure. In this case, the solid electrolyte may have the lithium salt arbitrarily provided at interstitial sites of the crystal structure. Specifically, the lithium salt may include lithium fluorohydrogenate. Thus, the solid electrolyte may be prepared by a reaction between the compound and the lithium fluorohydrogenate.

In this case, the lithium fluorohydrogenate may be prepared by adding lithium salt into the fluorohydrogenate precursor and reacting at a temperature lower than room temperature. Referring to FIG. 1, as described above, the lithium fluorohydrogenate may be prepared by using the fluorohydrogenate precursor. Accordingly, the fluorohydrogenate precursor may be prevented from being evaporated through a reaction at a temperature lower than room temperature.

Specifically, for example, if the lithium salt is lithium chloride (LiCl), the lithium fluorohydrogenate may be prepared by adding lithium chloride into the hydrofluoric acid aqueous solution at a concentration of 1M, and reacting at a temperature of −70° C. or lower for 24 hours. In this case, the lithium fluorohydrogenate may be prepared through an anion exchange reaction.

The solid electrolyte may be prepared by heating the compound at a temperature higher than room temperature and simultaneously adding the lithium fluorohydrogenate prepared as described above into the compound. For example, the solid electrolyte may be prepared by adding the lithium fluorohydrogenate in an amount of 1 to 10 mol % compared to the compound. As shown in FIG. 2, the lithium salt may be provided at the interstitial sites of the crystal structure of the compound, and thus may easily move within the crystal structure. Accordingly, the solid electrolyte may have an ion conductivity that becomes higher as an amount of the lithium fluorohydrogenate added increases.

In addition, for example, the solid electrolyte may be subject to a solid-liquid state change at a temperature of 70° C. or higher, and may have one crystal phase in a temperature range of 28 to 70° C. In other words, the solid electrolyte may have a melting point (a temperature of solid-liquid state change) that becomes lower than that of the compound due to lithium doping, and a temperature of solid-solid state change may vary.

According to an embodiment of the present invention, the compound and the solid electrolyte may show a relatively similar pattern in an X-ray diffraction pattern (XRD). Unlike the compound, however, the solid electrolyte may show a lithium-enriched phase. Accordingly, the compound and the solid electrolyte may have a different crystal orientation.

The solid electrolyte including the compound according to an embodiment of the present invention or the solid electrolyte doped with lithium may be used as an electrolyte for a secondary battery. For example, the secondary battery may include a positive electrode, a negative electrode, and the electrolyte. In this case, the electrolyte may be provided between the positive electrode and the negative electrode.

A method for designing a solid electrolyte according to an embodiment of the present invention will be described.

The solid electrolyte may include a compound in which cations and anions are bonded. In this case, the cations and the anions may be selected to have a maximum ion conductivity in a range satisfying a condition for allowing the compound to have a crystal phase.

The condition for allowing the compound to have a crystal phase may include a condition in which a molecular weight of the cation is 95 g/mol or more. In this case, the cation may include a pentagonal heterocyclic compound, in which the heterocyclic compound may have one element of sulfur, nitrogen, oxygen or phosphorus. Specifically, for example, the cation may include one of thiophenium represented by a following <Chemical Formula 10>, thiazolium represented by a following <Chemical Formula 11>, phospholanium represented by a following <Chemical Formula 12>, or oxathiolanium represented by a following <Chemical Formula 13> or <Chemical Formula 14>, or thiazolidinium represented by a following <Chemical Formula 15>.

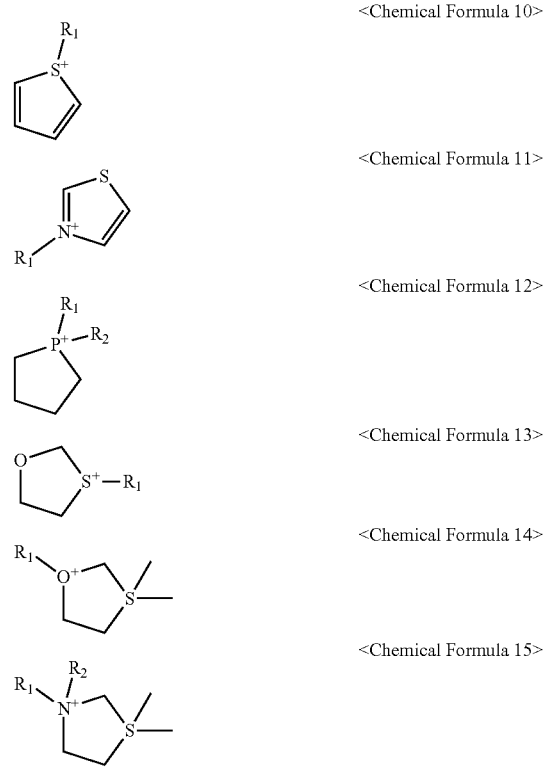

Conditions for allowing the compound to have a crystal phase may include a condition in which a molecular weight of the anion is more than 60 g/mol, and a hydrogen ion concentration (pH) of the anion is less than 3. Specifically, for example, the anion may include one of fluorohydrogenate represented by a following <Chemical Formula 16>, cyano(nitroso)methanide represented by a following <Chemical Formula 17>, or tetrazolidine represented by a following <Chemical Formula 18>.

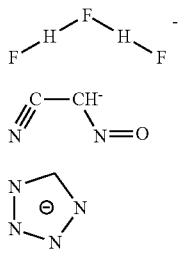

<Chemical Formula 16>

<Chemical Formula 17>

<Chemical Formula 18>

Unlike the above, if the anion has a molecular weight of 60 g/mol or less, the compound may exist in a liquid state. In other words, if the anion has a molecular weight of 60 g/mol or less, it may not be easy to form a solid having a crystal phase. Specifically, for example, if the cation includes one of thiophenium represented by the above <Chemical Formula 10> or thiazolium represented by the above <Chemical Formula 11>, and if the anion includes one of oxohydrogenate represented by a following <Chemical Formula 19> or cyanate represented by a following <Chemical Formula 20>, the compound may exist in an ionic liquid state.

 $O(HO)O_x^-$          <Chemical Formula 19>

 $O=C=N^-$          <Chemical Formula 20>

Thus, as described above, if the anion has a molecular weight of more than 60 g/mol, the compound may easily have a crystal phase. Specifically, for example, if the cation includes one of thiophenium represented by the above <Chemical Formula 10> or thiazolium represented by the above <Chemical Formula 11>, and if the anion includes one of fluorohydrogenate represented by the above <Chemical Formula 16>, cyano(nitroso)methanide represented by the above <Chemical Formula 17> or tetrazolidine represented by the above <Chemical Formula 18>, the compound may exist in a solid state of having the crystal phase.

Accordingly, the compound may have a crystal phase, if a molecular weight of the cation is 95 g/mol or more, a molecular weight of the anion is more than 60 g/mol, and a hydrogen ion concentration (pH) of the anion is less than 3. In this case, a condition for allowing the compound to have the crystal phase may be met, and an entropy of fusion of the compound may be 15-25 J/K. Accordingly, the crystal phase may have softness.

Unlike the above, if the entropy of fusion is 10 J/K or less, the compound may have a liquid state. Accordingly, the compound may not easily have a crystal phase. In addition, if the entropy of fusion is more than 35 J/K mol, the compound may have a crystalline solid state and may not have softness.

Thus, as described above, according to an embodiment of the present invention, the entropy of fusion may be 15-25 J/K mol, and thus the compound may easily have a crystal phase and a high ion conductivity at the same time.

According to an embodiment of the present invention, the solid electrolyte including the compound may be used as an electrolyte for a secondary battery. For example, the secondary battery may include a positive electrode, a negative electrode, and the electrolyte. In this case, the electrolyte may be provided between the positive electrode and the negative electrode.

According to a first embodiment of the present invention described above, the compound may include an organic piezoelectric material having piezoelectric properties.

Specifically, in this case, the compound may include a polycrystal having a plurality of microcrystals. In addition, as described above, a crystal structure of the compound may have softness. Thus, the cation and/or the anion may have a displacement within the crystal structure. Accordingly, there may occur an ionic polarization due to a relative displacement of the cation and the anion.

Unlike the compound described above, an inorganic compound including an inorganic matter may be subject to poling under a high voltage condition. Accordingly, the inorganic compound may have piezoelectric properties. In addition, the inorganic compound may be prepared by being heat-treated at a temperature higher than a temperature at which the compound is prepared as described above with reference to FIG. 1.

As described above, however, the compound according to an embodiment of the present invention may be subject to poling at a relatively low voltage to have piezoelectric properties. In addition, as described above with reference to FIG. 1, the compound may be prepared at a temperature equal to or lower than room temperature. Accordingly, the compound may have less time and costs required for a preparation process than those of the inorganic compound.

Specifically, the compound may have a piezoelectric coefficient of 105 to 125 pC/N in a temperature range of room temperature to 110° C. In this case, the compound may have a piezoelectric coefficient of 109 pC/N at room temperature. In addition, the compound may be subject to a phase transition into another crystal structure at 127° C., and thus the compound may not show piezoelectric properties. Thus, the compound may have piezoelectric properties in a temperature range of 127° C. or less.

In addition, the compound may have a piezoelectric coefficient of 105 to 125 pC/N in a frequency range of 25 to 250 Hz. In this case, the compound may have a piezoelectric coefficient corresponding to each frequency value. In other words, if a vibration mechanical energy represented by the frequency is applied to the compound, the compound may be converted into different electric signals according to a value of the applied energy. Accordingly, a piezoelectric element including the compound may be easily prepared.

FIG. 3 is a schematic view showing a self-generating secondary battery including an organic piezoelectric material according to an embodiment of the present invention.

Referring to FIG. 3, the self-generating secondary battery may include a positive electrode 160, a negative electrode 120, and an electrolyte 140 disposed between the positive electrode 160 and the negative electrode 120. In this case, the positive electrode 160 and the negative electrode 120 may include a positive electrode active material 150 and a negative electrode active material 130, respectively. As shown in FIG. 3, the positive electrode active material 150 and the negative electrode active material 130 may be provided in the form of particle onto the surfaces of the positive electrode 160 and the negative electrode 120 respectively, or may be mixed and provided in the positive electrode 160 and the negative electrode 120.

The electrolyte 140 may include a piezoelectric body. Accordingly, it may be possible to easily prepare a self-generating secondary battery that converts and stores vibration mechanical energy generated from movement of a human body, wind, wave or the like into electrical energy.

In this case, the electrolyte 140 may include a solid electrolyte containing the compound prepared according to an embodiment of the present invention and lithium salt.

As described above, the compound may have a high piezoelectric constant. In addition, the compound may have a high ion conductivity. Specifically, for example, if the compound includes a compound in which the methyl thiophenium and the fluorohydrogenate are bonded, the ion conductivity of the compound may be 126 S/cm. Accordingly, the solid electrolyte may be easily prepared by mixing lithium salt in the compound.

In addition, the self-generating secondary battery may have a first protective layer 170 on the outside of the positive electrode 160 and a second protective layer 110 on the outside of the negative electrode 120. Accordingly, the positive electrode 160, the negative electrode 120, and the electrolyte 140 may be protected from an external environment. In this case, the first protective layer 170 and the second protective layer 110 may include a polymer resin. Specifically, for example, the first protective layer 170 and the second protective layer 110 may include kapton, polyimide (PI), polyethylene terephthalate (PET), etc.

In contrast, as described above, the solid electrolyte may include the compound and lithium salt. As described with reference to FIG. 2, a unit cell of the compound may have an orthorhombic crystal structure, in which the thiophenium may be provided at a vertex and at a center of a face of the crystal structure, and the fluorohydrogenate may be provided in a middle of an edge of the crystal structure. In this case, as shown in FIG. 2, the solid electrolyte may have the lithium salt arbitrarily provided at interstitial sites of the crystal structure. Specifically, the lithium salt may include lithium fluorohydrogenate. Thus, the solid electrolyte may be prepared by a reaction between the compound and the lithium fluorohydrogenate.

If an external force is applied to the self-generating secondary battery according to an embodiment of the present invention, a piezoelectric field may be generated in the electrolyte 140 including the compound. Specifically, the piezoelectric field may be generated from an upper portion of the electrolyte 140 adjacent to the positive electrode 160 toward a lower portion of the electrolyte 140 adjacent to the negative electrode 120. Lithium ions may move from the positive electrode active material 150 to the negative electrode active material 130 by a piezoelectric field from the positive electrode 160 toward the negative electrode 120. Accordingly, a charge operation of the self-generating secondary battery may be performed by external force.

FIG. 4 shows sectional views of a piezoelectric sensor including an organic piezoelectric material according to an embodiment of the present invention, which represents a driving principle. Specifically, (a) of FIG. 4 is a sectional view showing the piezoelectric sensor before an external force is applied, and (b) of FIG. 4 is a sectional view showing the piezoelectric sensor to which an external force is applied.

Referring to FIG. 4, the piezoelectric sensor may include a first electrode 210, a second electrode 230, and a piezoelectric material layer 220 disposed between the first electrode 210 and the second electrode 230.

In this case, the piezoelectric material layer 220 may include a polycrystal. Accordingly, the piezoelectric material layer 220 may include a plurality of microcrystals 222. As shown in (a) of FIG. 4, the plurality of microcrystals 222 may have different polarization directions before an external force is applied to the piezoelectric sensor.

In contrast, as shown in (b) of FIG. 4, if an external force is applied to the piezoelectric sensor, the polarization inside the plurality of microcrystals 222 may be aligned in one direction. Accordingly, a piezoelectric field may be generated between the first electrode 210 and the second electrode 230, so that a potential difference may be formed between the first electrode 210 and the second electrode 230.

FIG. 5 is a block view showing a device including an organic piezoelectric material according to an embodiment of the present invention.

Referring to FIG. 5, the device may include a sensing unit 310, a driving unit 330, and a control unit 320 that converts an electrical signal obtained from the sensing unit 310 into physical energy to control the driving device 330.

The sensing unit 310 may sense a change in an external environment, convert the change into an electric signal, and provide the electric signal to the control unit 320. In this case, the change in the external environment may be variously selected according to a use of the device.

The control unit 320 may include an actuator containing a piezoelectric material. Accordingly, the piezoelectric material may be subject to a polarization phenomenon due to an electric signal provided from the sensing unit 310, while the electric signal may be converted into physical energy at the same time. In this case, the compound described above with reference to FIGS. 1 to 2 may have piezoelectric properties due to spontaneous ionic polarization. In addition, the compound may have a high piezoelectric coefficient, and thus may be provided as the piezoelectric material of the actuator. For example, the actuator may include a motor, a switch, etc.

The driving unit 330 may include a device that may be driven by the physical energy converted by the control unit 320. For example, the driving unit 330 may include a lighting, a mechanical device, etc.

FIG. 6 is a flowchart for explaining a method for preparing a solid electrolyte according to a second embodiment of the present invention.

Referring to FIG. 6, a mixed solution including thiazolium salt and a fluorohydrogenate precursor may be provided (S110).

According to one embodiment, the thiazolium salt may be prepared by reacting an alkyl group precursor solution and thiazoline.

In this case, the alkyl group precursor solution may be prepared by adding an alkyl group precursor material into a solvent and stirring at room temperature. For example, the solvent may include acetonitrile. Specifically, for example, the alkyl group precursor material may include one of dichloromethane represented by a following <Chemical Formula 21>, ethyl chloride represented by a following <Chemical Formula 22>, propyl chloride represented by a following <Chemical Formula 23>, or butyl chloride represented by a following <Chemical Formula 24>.

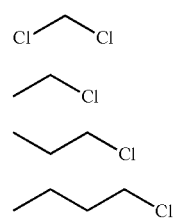

<Chemical Formula 21>

<Chemical Formula 22>

<Chemical Formula 23>

<Chemical Formula 24>

The thiazolium salt may be prepared by dripping the thiazoline into the alkyl group precursor solution prepared as described above, and reacting the resulting solution. Unlike the above, if a large amount of the thiazoline is added into the alkyl group precursor solution at one time, the reactivity between the thiazoline and the alkyl group precursor material may decrease, and thus it may not be easy to prepare the thiazolium salt.

Thus, as described above, if the thiazoline is dripped into the alkyl group precursor solution, the reactivity between the thiazoline and the alkyl group precursor material may be enhanced. In other words, a yield of the thiazolium salt may be enhanced.

In this case, as a length of a chain of the alkyl group precursor material increases, a time of the reaction may increase. Accordingly, as the length of the chain increases, a temperature of the reaction may increase, and thus the reactivity between the alkyl group precursor material and the thiazoline may be enhanced.

Accordingly, the thiazolium salt may include an alkyl group bonded with a nitrogen atom of the thiazolium. For example, the thiazolium salt may include thiazolium chloride containing one of a methyl group, an ethyl group, a propyl group or a butyl group.

Specifically, for example, if the alkyl group precursor solution includes dichloromethane represented by the above <Chemical Formula 1>, the thiazoline may be dripped into the solution containing the dichloromethane, and reacted at room temperature to prepare the thiazolium salt in which a carbon element of the dichloromethane is bonded with a nitrogen element of the thiazoline. In other words, the thiazolium salt containing a methyl group represented by a following <Chemical Formula 25> may be prepared.

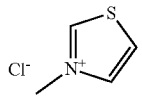

<Chemical Formula 25>

As another example, if the alkyl group precursor solution includes ethyl chloride represented by the above <Chemical Formula 2>, the thiazoline may be dripped into the solution containing the ethyl chloride, and reacted at a temperature higher than room temperature to prepare the thiazolium salt in which the ethyl chloride is bonded with a nitrogen element at 1-position of the thiazoline. In other words, the thiazolium salt containing an ethyl group represented by a following <Chemical Formula 26> may be prepared.

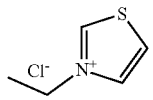

<Chemical Formula 26>

As still another example, if the alkyl group precursor solution includes propyl chloride represented by the above <Chemical Formula 3>, the thiazoline may be dripped into the solution containing the propyl chloride, and reacted at a temperature higher than room temperature to prepare the thiazolium salt in which the propyl chloride is bonded with a nitrogen element at 1-position of the thiazoline. In other words, the thiazolium salt containing a propyl group represented by a following <Chemical Formula 27> may be prepared.

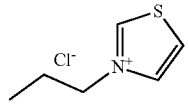

<Chemical Formula 27>

As still another example, if the alkyl group precursor solution includes butyl chloride represented by the above <Chemical Formula 4>, the thiazoline may be dripped into the solution containing the butyl chloride, and reacted at a temperature higher than room temperature to prepare the thiazolium salt in which the butyl chloride is bonded with a nitrogen element at 1-position of the thiazoline. In other words, the thiazolium salt containing a butyl group represented by a following <Chemical Formula 8> may be prepared.

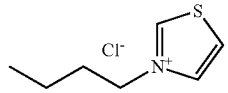

<Chemical Formula 28>

The fluorohydrogenate precursor may be prepared by stirring a solution containing hydrofluoric acid and water. Specifically, for example, the fluorohydrogenate precursor may be prepared by adding and stirring extra water into hydrofluoric acid at a concentration of 1M.

The mixed solution may be reacted to prepare a compound in which thiazolium and fluorohydrogenate are bonded (S120).

Specifically, for example, the mixed solution may be reacted at a temperature of −70° C. or less for 24 hours so as to prepare the compound in which the thiazolium and the fluorohydrogenate represented by a following <Chemical Formula 29> are bonded.

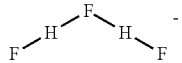

<Chemcial Formula 29>

Unlike the above, if the mixed solution is reacted at room temperature, the fluorohydrogenate precursor may be evaporated. Specifically, the fluorohydrogenate precursor may have a boiling point at a temperature equal to or less than room temperature, and thus may be volatilized at room temperature.

Thus, as described above, if the mixed solution is reacted at a temperature of −70° C., the compound may be easily prepared. In addition, as a temperature of the reaction decreases, a loss of the fluorohydrogenate may decrease, and thus a time of the reaction may decrease.

As described above, the compound may be composed of cations having the thiazolium and anions having the fluorohydrogenate and bonded to the cations. In addition, the compound may have a crystal phase.

A solid electrolyte including the compound and lithium salt may be prepared. In this case, the lithium salt may be arbitrarily provided at interstitial sites of the crystal structure of the compound. Specifically, the lithium salt may include lithium fluorohydrogenate. Thus, the solid electrolyte may be prepared by a reaction between the compound and the lithium fluorohydrogenate.

In this case, the lithium fluorohydrogenate may be prepared by adding lithium salt into the fluorohydrogenate precursor and reacting at a temperature lower than room temperature. Referring to FIG. 1, as described above, the lithium fluorohydrogenate may be prepared by using the fluorohydrogenate precursor. Accordingly, the fluorohydrogenate precursor may be prevented from being evaporated through a reaction at a temperature lower than room temperature.

Specifically, for example, if the lithium salt is lithium chloride (LiCl), the lithium fluorohydrogenate may be prepared by adding lithium chloride into the hydrofluoric acid aqueous solution at a concentration of 1M, and reacting at a temperature of −70° C. or lower for 24 hours. In this case, the lithium fluorohydrogenate may be prepared through an anion exchange reaction.

The solid electrolyte may be prepared by heating the compound at a temperature higher than room temperature and simultaneously adding the lithium fluorohydrogenate prepared as described above into the compound. For example, the solid electrolyte may be prepared by adding the lithium fluorohydrogenate in an amount of 1 to 10 mol % compared to the compound. The lithium salt may be provided at the interstitial sites of the crystal structure of the compound, and thus may easily move within the crystal structure. Accordingly, the solid electrolyte may have an ion conductivity that becomes higher with the addition of the lithium fluorohydrogenate.

The solid electrolyte including the compound according to an embodiment of the present invention or the solid electrolyte doped with lithium may be used as an electrolyte for a secondary battery. For example, the secondary battery may include a positive electrode, a negative electrode, and the electrolyte. In this case, the electrolyte may be provided between the positive electrode and the negative electrode.

An intermediate product a solid electrolyte according to a third embodiment of the present application will be described.

According to an embodiment of the present application, the intermediate product of the solid electrolyte may include a compound in which cations and anions are bonded, and a solvent mixed with the compound.

According to one embodiment, the cation may be thiophenium represented by <Chemical Formula 10> described above. The compound may include an alkyl group (R1) bonded with a sulfur element of the thiophenium.

In this case, for example, the cation may have a methyl group represented by <Chemical Formula 30> below, an ethyl group represented by <Chemical Formula 31>, a propyl group represented by <Chemical Formula 32> below, or a butyl group represented by <Formula 33>.

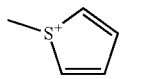

<Chemical Formula 30>

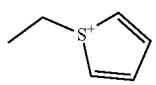

<Chemical Formula 31>

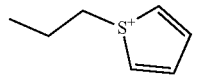

<Chemical Formula 32>

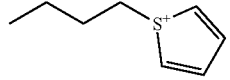

<Chemical Formula 33>

According to another embodiment, the cation may be thiazolium represented by <Chemical Formula 11> described above. The compound may include an alkyl group (R1) bonded with a nitrogen element of the thiazolium.

In this case, for example, the cation may have a methyl group represented by <Chemical Formula 34> below, an ethyl group represented by <Chemical Formula 35>, a propyl group represented by <Chemical Formula 36> below, or a butyl group represented by <Formula 37>.

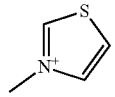

<Chemical Formula 34>

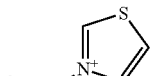

<Chemical Formula 35>

<Chemical Formula 36>

<Chemical Formula 37>

The anion may include fluorohydrogenate represented by <Chemical Formula 16> described above.

The compound may include a compound in which cations including the thiophenium and anions including the fluorohydrogenate are bonded, or may include a compound in which cations including the thiazolium and anions including the fluorohydrogenate are bonded.

The compound may be provided in a state in which the compound is dispersed or dissolved in the solvent. The solvent may include at least one of acetonitrile, tetrahydrofuran, DMSO, or DMF.

The intermediate product of the solid electrolyte including the compound and the solvent may be in a liquid or get state. The intermediate product of the solid electrolyte in a liquid or gel state may be stored, transported and distributed.

The solid electrolyte may be prepared by removing and drying the solvent included in the intermediate product of the solid electrolyte. The solid electrolyte may include a compound in which the cations including the thiophenium or the thiazolium and the anions including the fluorohydrogenate are bonded, may be in a flexible solid state, and may have crystallinity. In other words, the solid electrolyte may be in a flexible and crystalline solid state having a high ion conductivity, in which the cations and the anions are bonded.

The solid electrolyte may be provided between a positive electrode and a negative electrode to configure a secondary battery. In this case, according to one embodiment, a positive electrode active material included in the positive electrode may include lithium, phosphorus, and iron, and a negative electrode active material included in the negative electrode may include lithium.

A method for preparing an intermediate product of the solid electrolyte, a cation source for preparing the solid electrolyte, an anion source for preparing the solid electrolyte may be described.

A cation source and an anion source for preparing the solid electrolyte including the compound in which the cations and the anions are bonded may be provided.

If the cation is thiophenium, the cation source may include a solution containing an alkyl group, and thiophene. In this case, the cation source may include thiophenium salt. Alternately, if the cation is thiazolium, the cation source may include a solution containing an alkyl group, and thiazoline. In this case, the cation source may include thiazolium salt.

According to one embodiment, the solution containing the alkyl group may be prepared by adding an alkyl group precursor into a solvent and stirring at room temperature. For example, the solvent may be acetonitrile. Specifically, for example, the alkyl group precursor may be one of dichloromethane represented by <Chemical Formula 1> described above, ethyl chloride represented by <Chemical Formula 2> described above, propyl chloride represented by <Chemical Formula 3> described above, or butyl chloride represented by <Chemical Formula 4> described above.

The cation source may be prepared by dripping and reacting the thiophene or the thiazolin into the solution containing the alkyl group. Unlike the above, if a large amount of the thiophene or the thiazolin is added into the solution containing the alkyl group at one time, the reactivity between the thiophene or the thiazolin and the solution containing the alkyl group may decrease, and thus it may not be easy to prepare the cation source.

Accordingly, as described above, the thiophene or the thiazolin may be dripped into the solution containing the alkyl group, and thus the reactivity between the thiophene or the thiazolin and the solution containing the alkyl group may increase to enhance a yield of the thiophenium salt or the thiazoline salt.

According to one embodiment, as a length of a chain of the alkyl group in the solution containing the alkyl group increases, a reaction time may increase. Thus, as the length of the chain of the alkyl group increases, a temperature of the reaction may increase. Accordingly, a manufacturing process time for the cation source may be shortened and a manufacturing cost may be reduced, and thus mass production may be facilitated.

As described above, the thiophenium salt may include an alkyl group bonded with a sulfur atom of the thiophenium. For example, the thiophenium salt may be thiophenium chloride including at least one of a methyl group, an ethyl group, a propyl group or a butyl group, as represented by <Chemical Formula 5> to <Chemical Formula 8>.

As described above, the thiazolium salt may include an alkyl group bonded with a nitrogen atom of the thiazolium. For example, the thiazolium salt may be thiazolium chloride including one of a methyl group, an ethyl group, a propyl group or a butyl group, as represented by <Chemical Formula 25> to <Chemical Formula 28>.

The anion source may include a solvent including water and hydrofluoric acid mixed in the solvent. Specifically, the anion source prepared by stirring hydrofluoric acid and water may be a fluorohydrogenate precursor.

According to one embodiment, the anion source may further include lithium salt in addition to the solvent and the hydrofluoric acid. For example, the lithium salt may include lithium chloride. In this case, the anion source may be a lithium fluorohydrogenate precursor.

The cation source and the anion source may be stored, transported, and distributed in a liquid state while being provided in a container. The container may include an air conditioner which creates an environment suitable for storing the cation source and the anion source, and thus a temperature, humidity, and pressure inside the container may be adjusted.

An intermediate product of the solid electrolyte may be prepared by mixing the cation source and the anion source.

Specifically, the intermediate product of the solid electrolyte may be prepared by preparing a mixed solution in which the cation source and the anion source are mixed, and reacting the mixed solution. The mixed solution may be reacted at a temperature lower than room temperature (e.g., $-70°$ C.) Unlike the above, if the mixed solution is reacted at room temperature, the fluorohydrogenate precursor may be evaporated. Specifically, the fluorohydrogenate precursor may have a boiling point at a temperature equal to or lower than room temperature, and thus may be volatilized at room temperature.

Thus, as described above, if the mixed solution is reacted at a temperature below room temperature, the intermediate product of the solid electrolyte can be easily prepared. In addition, as a temperature of the reaction decreases, a loss of the fluorohydrogenate precursor may decrease, and thus a reaction time may decrease.

According to an embodiment of the present application, the intermediate product of the solid electrolyte may be provided in a liquid or gel state, and the cation source and the anion source for preparing the solid electrolyte may be provided in a liquid state. Thus, compared to those provided in a solid state, the intermediate product of the solid electrolyte, the cation source, and the anion source can be easily stored, distributed, and transported. Accordingly, the cost for preparing the solid electrolyte can be saved, and mass production of the solid electrolyte can be facilitated.

Hereinafter, a method for preparing a solid electrolyte according to the above-described first embodiment of the present invention and the results of evaluating properties will be described.

Preparing of Compound According to Experimental Example 1-1

Dichloromethane represented by the above <Chemical Formula 1> was provided as an alkyl group precursor material.

Acetonitrile was provided into a conical flask, after which the dichloromethane was added and stirred at room temperature for 10 minutes to prepare an alkyl group precursor solution. In this case, the preparation of the alkyl group precursor solution was performed in a glove box without moisture.

Thiophene was dripped into the alkyl group precursor solution while being stirred, after which a uniformly mixed solution was slowly stirred at room temperature for four days so as to prepare thiophenium salt having a methyl group.

A washing process was performed by providing the thiophenium salt and a solvent of ethyl acetate and diethyl ether into a rotary concentrator.

A 1M hydrofluoric acid and extra water was added into a conical flask and stirred for 10 minutes to prepare a fluorohydrogenate precursor.

The thiophenium salt was added into the fluorohydrogenate precursor to prepare a mixed solution. The mixed solution was left alone at a temperature of −70° C. for 24 hours, so as to prepare a compound in which the thiophenium salt and the fluorohydrogenate were bonded.

The compound was provided into a glove box under a nitrogen atmosphere and left alone at room temperature for two to three hours, so that volatile gas was removed. After that, a drying process was performed by providing the compound into the rotary concentrator, so as to prepare a compound according to Experimental Example 1-1.

Preparing of Compound According to Experimental Example 1-2

A compound was prepared by the same method as described above in Experimental Example 1-1. However, instead of the dichloromethane, ethyl chloride represented by the above <Chemical Formula 2> was provided as the alkyl group precursor material. In addition, in the preparing of thiophenium, a reaction was performed at a temperature of 60 to 80° C. for two to three days instead of the reaction at room temperature for four days, so as to prepare a compound according to Experimental Example 1-2.

Preparing of Compound According to Experimental Example 1-3

A compound was prepared by the same method as described above in Experimental Example 1-1. However, instead of the dichloromethane, propyl chloride represented by the above <Chemical Formula 3> was provided as the alkyl group precursor material. In addition, in the preparing of thiophenium, a reaction was performed at a temperature of 60 to 80° C. for two to three days instead of the reaction at room temperature for four days, so as to prepare a compound according to Experimental Example 1-3.

Preparing of Compound According to Experimental Example 1-4

A compound was prepared by the same method as described above in Experimental Example 1-1. However, instead of the dichloromethane, butyl chloride represented by the above <Chemical Formula 4> was provided as the alkyl group precursor material. In addition, in the preparing of thiophenium, a reaction was performed at a temperature of 60 to 80° C. for two to three days instead of the reaction at room temperature for four days, so as to prepare a compound according to Experimental Example 1-4.

Preparing of Compound According to Experimental Example 2-1

As for a cation, thiazolium represented above was provided. In this case, the $R_1$ represents an methyl group.

As for an anion, fluorohydrogenate prepared according to Experimental Example 1-1 described above was used to prepare a compound according to Experimental Example 1-1.

Preparing of Compound According to Experimental Example 2-2

A compound was prepared by the same method as described above in Experimental Example 1-2, but thiazolin was added into a solution containing an alkyl group so as to prepare thiazolium salt with a cation source.

After that, thiazolium salt and a fluorohydrogenate precursor were reacted by the same method as described above in Experimental Example 1-2, so as to prepare the compound according to Experimental Example 2-2, in which thiazolium cations having an ethyl group (R1) and fluorohydrogenate anions are bonded.

Preparing of Compound According to Experimental Example 2-3

A compound was prepared by the same method as described above in Experimental Example 1-3, but thiazolin was added into a solution containing an alkyl group so as to prepare thiazolium salt with a cation source.

After that, thiazolium salt and a fluorohydrogenate precursor were reacted by the same method as described above in Experimental Example 1-3, so as to prepare the compound according to Experimental Example 2-3, in which thiazolium cations having a propyl group (R1) and fluorohydrogenate anions are bonded.

Preparing of Compound According to Experimental Example 2-4

A compound was prepared by the same method as described above in Experimental Example 1-4, but thiazolin was added into a solution containing an alkyl group so as to prepare thiazolium salt with a cation source.

After that, thiazolium salt and a fluorohydrogenate precursor were reacted by the same method as described above in Experimental Example 1-4, so as to prepare the compound according to Experimental Example 2-4, in which thiazolium cations having a butyl group (R1) and fluorohydrogenate anions are bonded.

Preparing of Compound According to Experimental Example 3-1

Phospholanium represented by <Chemical Formula 12> was provided as a cation, and fluorohydrogenate prepared according to Experimental Example 1-1 as described above was used as an anion, so as to prepare the compound according to Experimental Example 3-1, in which phospholanium cations having a methyl group (R1) and an ethyl group (R2) and fluorohydrogenate anions are bonded.

Preparing of Compound According to Experimental Example 3-2

A compound was prepared by the same method as described above in Experimental Example 3-1, so as to prepare the compound according to Experimental Example 3-2, in which phospholanium cations having a methyl group (R1) and a propyl group (R2) and fluorohydrogenate anions are bonded.

Preparing of Compound According to Experimental Example 3-3

A compound was prepared by the same method as described above in Experimental Example 3-1, so as to prepare the compound according to Experimental Example 3-3, in which phospholanium cations having a methyl group (R1) and a butyl group (R2) and fluorohydrogenate anions are bonded.

Preparing of Compound According to Experimental Example 3-4

As for a cation, phospholanium represented by the above <Chemical Formula 12> was provided.

In this case, the $R_1$ and $R_2$ represent an ethyl group and a butyl group, respectively.

As for an anion, fluorohydrogenate prepared according to Experimental Example 1-1 described above was used to prepare a compound according to Experimental Example 3-4.

Preparing of Compound According to Experimental Example 3-5

A compound was prepared by the same method as described above in Experimental Example 3-1, so as to prepare the compound according to Experimental Example 3-5, in which phospholanium cations having a methyl group (R1) and a methyl group (R2) and fluorohydrogenate anions are bonded.

Preparing of Compound According to Experimental Example 4-1

Oxathiolanium represented by <Chemical Formula 14> was provided as a cation, and fluorohydrogenate prepared according to Experimental Example 1-1 as described above was used as an anion, so as to prepare the compound according to Experimental Example 4-1, in which oxathiolanium cations having a methyl group (R1) and fluorohydrogenate anions are bonded.

Preparing of Compound According to Experimental Example 4-2

A compound was prepared by the same method as described above in Experimental Example 4-1, so as to prepare the compound according to Experimental Example 4-2, in which oxathiolanium cations having an ethyl group (R1) and fluorohydrogenate anions are bonded.

Preparing of Compound According to Experimental Example 4-3

A compound was prepared by the same method as described above in Experimental Example 4-1, so as to prepare the compound according to Experimental Example 4-3, in which oxathiolanium cations having a propyl group (R1) and fluorohydrogenate anions are bonded.

Preparing of Compound According to Experimental Example 4-4

A compound was prepared by the same method as described above in Experimental Example 4-1, so as to prepare the compound according to Experimental Example 4-4, in which oxathiolanium cations having a butyl group (R1) and fluorohydrogenate anions are bonded.

Preparing of Compound According to Experimental Example 5-1

Ammonium was provided as a cation, and fluorohydrogenate prepared according to Experimental Example 1-1 as described above was used as an anion, so as to prepare the compound according to Experimental Example 5-1, in which ammonium cations having a tetraethyl group and fluorohydrogenate anions are bonded.

Preparing of Compound According to Experimental Example 5-2

A compound was prepared by the same method as described above in Experimental Example 5-1, so as to prepare the compound according to Experimental Example 5-2, in which ammonium cations having a tetrabutyl group and fluorohydrogenate anions are bonded.

Preparing of Compound According to Experimental Example 5-3

A compound was prepared by the same method as described above in Experimental Example 5-1, so as to prepare the compound according to Experimental Example 5-3, in which ammonium cations having a trimethyl group and fluorohydrogenate anions are bonded.

Preparing of Compound According to Experimental Example 5-4

A compound was prepared by the same method as described above in Experimental Example 5-1, so as to prepare the compound according to Experimental Example 5-4, in which ammonium cations having a diethylmethyl group and fluorohydrogenate anions are bonded.

Preparing of Compound According to Experimental Example 6-1

Sulphonium was provided as a cation, and fluorohydrogenate prepared according to Experimental Example 1-1 as described above was used as an anion, so as to prepare the compound according to Experimental Example 6-1, in which sulphonium cations having a trimethyl group and fluorohydrogenate anions are bonded.

Preparing of Compound According to Experimental Example 6-2

A compound was prepared by the same method as described above in Experimental Example 6-1, so as to prepare the compound according to Experimental Example 6-2, in which sulphonium cations having a trimethyl group and fluorohydrogenate anions are bonded.

Preparing of Compound According to Experimental Example 7-1

Phosphonium was provided as a cation, and fluorohydrogenate prepared according to Experimental Example 1-1 as described above was used as an anion, so as to prepare the compound according to Experimental Example 7-1, in which phosphonium cations having a trimethyl group and fluorohydrogenate anions are bonded.

Preparing of Compound According to Experimental Example 7-2

A compound was prepared by the same method as described above in Experimental Example 7-1, so as to prepare the compound according to Experimental Example 7-2, in which phosphonium cations having a triethyl group and fluorohydrogenate anions are bonded.

Preparing of Compound According to Experimental Example 7-3

A compound was prepared by the same method as described above in Experimental Example 7-1, so as to prepare the compound according to Experimental Example 7-3, in which phosphonium cations having a tributyldecyl group and fluorohydrogenate anions are bonded.

Preparing of Compound According to Experimental Example 8-1

As for a cation, a methyl group and an ethyl group were bonded to nitrogen of thiazolidinium represented by the above <Chemical Formula 15>, and two methyl groups were bonded to sulfur of thiazolidinium.

As for an anion, fluorohydrogenate prepared according to Experimental Example 1-1 described above was used to prepare a compound according to Experimental Example 8-1.

Preparing of Compound According to Experimental Example 8-2

A compound was prepared by the same method as described above in Experimental Example 8-1, so as to prepare the compound according to Experimental Example 8-2, in which thiazolidinium cations having a methyl group (R1) and a propyl group (R2) bonded to a nitrogen atom, and two methyl groups bonded to a sulfur atom, and fluorohydrogenate anions are bonded.

Preparing of Compound According to Experimental Example 8-3

A compound was prepared by the same method as described above in Experimental Example 8-1, so as to prepare the compound according to Experimental Example 8-3, in which thiazolidinium cations having a methyl group (R1) and a butyl group (R2) bonded to a nitrogen atom, and two methyl groups bonded to a sulfur atom, and fluorohydrogenate anions are bonded.

Preparing of Compound According to Experimental Example 8-4

A compound was prepared by the same method as described above in Experimental Example 8-1, so as to prepare the compound according to Experimental Example 8-4, in which thiazolidinium cations having an ethyl group (R1) and a butyl group (R2) bonded to a nitrogen atom, and two methyl groups bonded to a sulfur atom, and fluorohydrogenate anions are bonded.

Preparing of Compound According to Experimental Example 9-1

As for a cation, imidazolium represented by the above <Chemical Formula 38> was provided. In this case, the $R_1$ and $R_2$ represent a methyl group and an ethyl group, respectively.

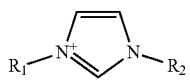

<Chemical Formula 38>

As for an anion, fluorohydrogenate prepared according to Experimental Example 1-1 described above was used to prepare a compound according to Experimental Example 9-1.

Preparing of Compound According to Experimental Example 9-2

A compound was prepared by the same method as described above in Experimental Example 9-1, so as to prepare the compound according to Experimental Example 9-2, in which imidazolium cations having a methyl group (R1) and a propyl group (R2) and fluorohydrogenate anions are bonded.

Preparing of Compound According to Experimental Example 9-3

A compound was prepared by the same method as described above in Experimental Example 9-1, so as to prepare the compound according to Experimental Example 9-3, in which imidazolium cations having a methyl group (R1) and a butyl group (R2) and fluorohydrogenate anions are bonded.

Preparing of Compound According to Experimental Example 9-4

A compound was prepared by the same method as described above in Experimental Example 9-1, so as to prepare the compound according to Experimental Example 9-4, in which imidazolium cations having an ethyl group (R1) and a butyl group (R2) and fluorohydrogenate anions are bonded.

Preparing of Compound According to Experimental Example 10-1

As for a cation, pyrrolidinium represented by a following <Chemical Formula 39> was provided.

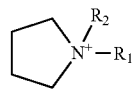

<Chemical Formula 39>

In this case, the $R_1$ and $R_2$ represent an methyl group and a ethyl group, respectively.

As for an anion, fluorohydrogenate prepared according to Experimental Example 1-1 described above was used to prepare a compound according to Experimental Example 10-1.

Preparing of Compound According to Experimental Example 10-2

A compound was prepared by the same method as described above in Experimental Example 10-1, so as to prepare the compound according to Experimental Example 10-2, in which pyrrolidinium cations having a methyl group (R1) and a propyl group (R2) and fluorohydrogenate anions are bonded.

Preparing of Compound According to Experimental Example 10-3

A compound was prepared by the same method as described above in Experimental Example 10-1, so as to prepare the compound according to Experimental Example 10-3, in which pyrrolidinium cations having a methyl group (R1) and a butyl group (R2) and fluorohydrogenate anions are bonded.

Preparing of Compound According to Experimental Example 10-4

A compound was prepared by the same method as described above in Experimental Example 10-1, so as to prepare the compound according to Experimental Example 10-4, in which pyrrolidinium cations having an ethyl group (R1) and a butyl group (R2) and fluorohydrogenate anions are bonded.

Preparing of Compound According to Experimental Example 10-5

A compound was prepared by the same method as described above in Experimental Example 10-1, so as to prepare the compound according to Experimental Example 10-5, in which pyrrolidinium cations having a methyl group (R1) and a methyl group (R2) and fluorohydrogenate anions are bonded.

The ion conductivity of the compounds according to Experimental Examples 1-1 to 10-5 was measured at room temperature, and the ion molecular weight of cations and the state information of the compounds according to Experimental Examples 1-1 to 10-5 are summarized as shown in <Table 1>.

TABLE 1

| Classification | Cation | Alkyl group | Ion molecular weight (g/mol) | State | Ion conductivity (mS/cm$^2$) |
|---|---|---|---|---|---|
| Experimental Example 1-1 | Thiophenium | Methyl group | 99.15 | Crystalline solid | 126 |
| Experimental Example 1-2 | | Ethyl group | 113.14 | Crystalline solid | 103 |
| Experimental Example 1-3 | | Propyl group | 127.15 | Crystalline solid | 68 |
| Experimental Example 1-4 | | Butyl group | 142.16 | Crystalline solid | 46 |
| Experimental Example 2-1 | Thiazolium | Methyl group | 101.13 | Crystalline solid | 45 |
| Experimental Example 2-2 | | Ethyl group | 114.14 | Crystalline solid | 74 |
| Experimental Example 2-3 | | Propyl group | 126.15 | Crystalline solid | 18.9 |

TABLE 1-continued

| Classification | Cation | Alkyl group | Ion molecular weight (g/mol) | State | Ion conductivity (mS/cm²) |
|---|---|---|---|---|---|
| Experimental Example 2-4 | | Butyl group | 143.13 | Crystalline solid | 6.8 |
| Experimental Example 3-1 | Phospholanium | Methyl group/Ethyl group | 130.97 | Crystalline solid | 2 |
| Experimental Example 3-2 | | Methyl group/Propyl group | 143.1 | Crystalline solid | 35 |
| Experimental Example 3-3 | | Methyl group/Butyl group | 159.9 | Crystalline solid | 16 |
| Experimental Example 3-4 | | Ethyl group/Butyl group | 174 | Crystalline solid | 45 |
| Experimental Example 3-5 | | Methyl group/Methyl group | 117 | Crystalline solid | 24 |
| Experimental Example 4-1 | Oxathiolanium | Methyl group | 106.06 | Crystalline solid | 12 |
| Experimental Example 4-2 | | Ethyl group | 120.07 | Crystalline solid | 17.5 |
| Experimental Example 4-3 | | Propyl group | 132.06 | Crystalline solid | 26.5 |
| Experimental Example 4-4 | | Butyl group | 149.06 | Crystalline solid | 21.1 |
| Experimental Example 5-1 | Ammonium | Tetraethyl group | 130.25 | Crystalline solid | 12.5 |
| Experimental Example 5-2 | | Tetrabutyl group | 242.46 | Crystalline solid | 10.1 |
| Experimental Example 5-3 | | Tetramethyl group | 59.11 | Ionic liquid | 9.4 |
| Experimental Example 5-4 | | Diethylmethyl group | 88.9 | Ionic liquid | 8.1 |
| Experimental Example 6-1 | Sulfonium | Trimethyl group | 77.04 | Ionic liquid | 8.4 |
| Experimental Example 6-2 | | Triethyl group | 119.06 | Crystalline solid | 5.6 |
| Experimental Example 7-1 | Phosphonium | Trimethyl group | 77.09 | Ionic liquid | 5.7 |
| Experimental Example 7-2 | | Triethyl group | 119.16 | Crystalline solid | 4.9 |
| Experimental Example 7-3 | | Tributyldecyl group | 343.59 | Crystalline solid | 2.8 |
| Experimental Example 8-1 | Thiazolidinium | Methyl group/Ethyl group Methyl group/Methyl group | 99.15 | Crystalline solid | 60 |
| Experimental Example 8-2 | | Methyl group/Propyl group Methyl group/Methyl group | 113.14 | Crystalline solid | 19.6 |
| Experimental Example 8-3 | | Methyl group/Butyl group Methyl group/Methyl group | 127.15 | Crystalline solid | 28.7 |
| Experimental Example 8-4 | | Ethyl group/Butyl group Methyl group/Methyl group | 142.16 | Crystalline solid | 5.8 |
| Experimental Example 9-1 | Imidazolium | Methyl group/Ethyl group | 112.07 | Crystalline solid | 14 |
| Experimental Example 9-2 | | Methyl group/Propyl group | 124.08 | Crystalline solid | 6.5 |

TABLE 1-continued

| Classification | Cation | Alkyl group | Ion molecular weight (g/mol) | State | Ion conductivity (mS/cm$^2$) |
|---|---|---|---|---|---|
| Experimental Example 9-3 | | Methyl group/Butyl group | 141.08 | Crystalline solid | 8.9 |
| Experimental Example 9-4 | | Ethyl group/Butyl group | 155.07 | Crystalline solid | 2.5 |
| Experimental Example 10-1 | Pyrrolidinium | Methyl group/Ethyl group | 115.12 | Crystalline solid | 7 |
| Experimental Example 10-2 | | Methyl group/Propyl group | 127.13 | Crystalline solid | 5.3 |
| Experimental Example 10-3 | | Methyl group/Butyl group | 144.12 | Crystalline solid | 14.5 |
| Experimental Example 10-4 | | Ethyl group/Butyl group | 158.12 | Crystalline solid | 20 |
| Experimental Example 10-5 | | Methyl group/Methyl group | 101.13 | Crystalline solid | 0.9 |

As can be understood from <Table 1>, it can be confirmed that compounds have a high ion conductivity, if thiophenium is included as a cation (Experimental Examples 1-1 to 1-4), if thiazolium having a methyl group, an ethyl group, or a propyl group is included (Experimental Examples 2-1 to 2-3), if phospholanium having a methyl group/propyl group, a methyl group/butyl group, an ethyl group/butyl group, or a methyl group/methyl group is included (Experimental Examples 3-2 to 3-5), if oxathiolanium having an ethyl group, a propyl group, or a butyl group is included (Experimental Examples 4-2 to 4-4), if a thiazolidinium having a methyl group/ethyl group, a methyl group/propyl group, and a methyl group/butyl group is included (Experimental Examples 8-1 to 8-3).

Thiophenium having a methyl group identified as having the highest ion conductivity in <Table 1> was fixed as a cation and a type of anion was varied to prepare compounds for a solid electrolyte according to Experimental Examples 11-1 to 11-18.

Preparing of Compound According to Experimental Example 11-1

Chlorine ion was provided as an anion so as to prepare a compound according to Experimental Example 11-1 in which thiophenium cations having a methyl group according to Experimental Example 1-1 as described above and chlorine anions are bonded.

Preparing of Compound According to Experimental Example 11-2

Cyanate was provided as an anion so as to prepare a compound according to Experimental Example 11-2 in which thiophenium cations having a methyl group according to Experimental Example 1-1 as described above and cyanate anions are bonded.

Preparing of Compound According to Experimental Example 11-3

Oxohydrogenate was provided as an anion so as to prepare a compound according to Experimental Example 11-3 in which thiophenium cations having a methyl group according to Experimental Example 1-1 as described above and oxohydrogenate anions are bonded.

Preparing of Compound According to Experimental Example 11-4

SCN was provided as an anion so as to prepare a compound according to Experimental Example 11-4 in which thiophenium cations having a methyl group according to Experimental Example 1-1 as described above and SCN anions are bonded.

Preparing of Compound According to Experimental Example 11-5

Nitrogen was provided as an anion so as to prepare a compound according to Experimental Example 11-5 in which thiophenium cations having a methyl group according to Experimental Example 1-1 as described above and nitrogen anions are bonded.

Preparing of Compound According to Experimental Example 11-6

N(CN)$_2$ was provided as an anion so as to prepare a compound according to Experimental Example 11-6 in which thiophenium cations having a methyl group according to Experimental Example 1-1 as described above and N(CN)$_2$ anions are bonded.

Preparing of Compound According to Experimental Example 11-7

Cyano(nitroso)methanide was provided as an anion so as to prepare a compound according to Experimental Example 11-7 in which thiophenium cations having a methyl group according to Experimental Example 1-1 as described above and cyano(nitroso)methanide anions are bonded.

Preparing of Compound According to Experimental Example 11-8

Tetrazolidine was provided as an anion so as to prepare a compound according to Experimental Example 11-8 in which thiophenium cations having a methyl group according to Experimental Example 1-1 as described above and tetrazolidine anions are bonded.

Preparing of Compound According to Experimental Example 11-9

Bromine was provided as an anion so as to prepare a compound according to Experimental Example 11-9 in which thiophenium cations having a methyl group according to Experimental Example 1-1 as described above and bromine anions are bonded.

Preparing of Compound According to Experimental Example 11-10

$BF_4$ was provided as an anion so as to prepare a compound according to Experimental Example 11-10 in which thiophenium cations having a methyl group according to Experimental Example 1-1 as described above and $BF_4$ anions are bonded.

Preparing of Compound According to Experimental Example 11-11

Dihydrogen phosphate was provided as an anion so as to prepare a compound according to Experimental Example 11-11 in which thiophenium cations having a methyl group according to Experimental Example 1-1 as described above and dihydrogen phosphate anions are bonded.

Preparing of Compound According to Experimental Example 11-12

Hydrogensulfate was provided as an anion so as to prepare a compound according to Experimental Example 11-12 in which thiophenium cations having a methyl group according to Experimental Example 1-1 as described above and hydrogensulfate anions are bonded.

Preparing of Compound According to Experimental Example 11-13

Dimethyl phosphate was provided as an anion so as to prepare a compound according to Experimental Example 11-13 in which thiophenium cations having a methyl group according to Experimental Example 1-1 as described above and dimethyl phosphate anions are bonded.

Preparing of Compound According to Experimental Example 11-14

Iodine was provided as an anion so as to prepare a compound according to Experimental Example 11-14 in which thiophenium cations having a methyl group according to Experimental Example 1-1 as described above and iodine anions are bonded.

Preparing of Compound According to Experimental Example 11-15

$PF_6$ was provided as an anion so as to prepare a compound according to Experimental Example 11-15 in which thiophenium cations having a methyl group according to Experimental Example 1-1 as described above and $PF_6$ anions are bonded.

Preparing of Compound According to Experimental Example 11-16

Trifluoromethanesulfonate was provided as an anion so as to prepare a compound according to Experimental Example 11-16 in which thiophenium cations having a methyl group according to Experimental Example 1-1 as described above and trifluoromethanesulfonate anions are bonded.

Preparing of Compound According to Experimental Example 11-17

FSI was provided as an anion so as to prepare a compound according to Experimental Example 11-17 in which thiophenium cations having a methyl group according to Experimental Example 1-1 as described above and FSI anions are bonded.

Preparing of Compound According to Experimental Example 11-18

TFSI was provided as an anion so as to prepare a compound according to Experimental Example 11-18 in which thiophenium cations having a methyl group according to Experimental Example 1-1 as described above and TFSI anions are bonded.

The ion conductivity of the compounds according to Experimental Examples 11-11 to 11-17 was measured at room temperature, and the molecular weight of anions, the state information of the compounds according to Experimental Examples 11-1 to 11-17, pH of anions, and an entropy of fusion of the compounds according to Experimental Examples 11-1 to 11-17 are summarized as shown in <Table 2>.

TABLE 2

| Classification | Anion | Ion molecular weight (g/mol) | State | Ion conductivity (mS/cm$^2$) | pH | Entropy of fusion (J/Kmol) |
|---|---|---|---|---|---|---|
| Experimental Example 11-1 | Chlorine | 35.45 | Ionic liquid | 3.6 | More than 3 | 9.3 |
| Experimental Example 11-2 | Cyanate | 42 | Ionic liquid | 4.3 | | 8.1 |
| Experimental Example 11-3 | Oxohydrogenate | 48 | Ionic liquid | 5.8 | | 7.6 |
| Experimental Example 11-4 | SCN | 58.08 | Ionic liquid | 3.9 | | 6.4 |
| Experimental Example 11-5 | Nitrogen | 62 | Crystalline solid | 4.1 | Less than 3 | 36 |
| Experimental Example 1-1 | Fluorohydrogenate | 63 | Crystalline solid | 126 | | 23.6 |
| Experimental Example 11-6 | N(CN)$_2$ | 66 | Crystalline solid | 3.6 | | 36 |
| Experimental Example 11-7 | Cyano(nitro)methanide | 69 | Crystalline solid | 48.6 | | 24.9 |
| Experimental Example 11-8 | Tetrazolidine | 72 | Crystalline solid | 69.4 | | 24.3 |
| Experimental Example 11-9 | Bromine | 79.90 | Crystalline solid | 2.6 | | 35.6 |
| Experimental Example 11-10 | BF$_4$ | 86.81 | Crystalline solid | 6.9 | | 38.1 |
| Experimental Example 11-11 | Dihydrogenphosphate | 96.98 | Crystalline solid | 3.3 | | 43.2 |
| Experimental Example 11-12 | Hydrogensulfate | 97.07 | Crystalline solid | 16.9 | | 47.6 |

TABLE 2-continued

| Classification | Anion | Ion molecular weight (g/mol) | State | Ion conductivity (mS/cm²) | pH | Entropy of fusion (J/Kmol) |
|---|---|---|---|---|---|---|
| Experimental Example 11-13 | Dimethylphosphate | 126.05 | Crystalline solid | 8.1 | | 49.3 |
| Experimental Example 11-14 | Iodine | 126.9 | Crystalline solid | 5.1 | | 45.2 |
| Experimental Example 11-15 | $PF_6$ | 145 | Crystalline solid | 23 | | 39.8 |
| Experimental Example 11-16 | Trifluoromethanesulfonate | 164.1 | Crystalline solid | 12.6 | | 42.8 |
| Experimental Example 11-17 | FSI | 180.13 | Crystalline solid | 35 | | 41.7 |
| Experimental Example 11-18 | TFSI | 280.135 | Crystalline solid | 29 | | 46.9 |

As can be understood from <Table 2>, it can be confirmed that compounds have a high ion conductivity, if fluorohydrogenate is included as an anion (Experimental Example 1-1), if cyano(nitroso)methanide is included (Experimental Example 11-7), or if tetrazolidine is included (Experimental Examples 11-8).

In addition, if a molecular weight of the anion is 60 g/mol or less (more specifically, 58.08 g/mol or less), and if a pH of the anion is greater than 3, it can be confirmed that a compound in which cations and anions are bonded is not a crystalline solid but an ionic liquid. In addition, if a molecular weight of the anion is more than 60 g/mol (more specifically, 62 g/mol or less), and if a pH of the anion is less than 3, it can be confirmed that a compound in which cations and anions are bonded is maintained as a crystalline solid.

In addition, if a molecular weight of the anion is more than 60 g/mol (more specifically, 62 g/mol or more), and if a pH of the anion is less than 3 and an entropy of fusion is 15-25 J/Kmol (more specifically, more than 9.3 J/Kmol and less than 35.6 J/Kmol, it can be confirmed that a compound has a high ion conductivity.

Preparing of Solid Electrolyte According to Experimental Example 12-1

A 1M hydrofluoric acid aqueous solution and lithium chloride (LiCl) were added into a container and left alone at a temperature of −70° C. for 24 hours, so as to prepare lithium fluorohydrogenate.

A compound having a methyl group according to Experimental Example 1-1 described above was heated to 60° C. and the lithium fluorohydrogenate was added in an amount of 1 mol % at the same time and reacted for two hours, so as to prepare a solid electrolyte according to Experimental Example 12-1.

Preparing of Solid Electrolyte According to Experimental Example 12-2

A solid electrolyte was prepared by the same method as described above in Experimental Example 12-1. However, the lithium fluorohydrogenate was added in an amount of 5 mol % instead of 1 mol %, so as to prepare a solid electrolyte according to Experimental Example 12-2.

Preparing of Solid Electrolyte According to Experimental Example 12-3

A solid electrolyte was prepared by the same method as described above in Experimental Example 12-1. However, the lithium fluorohydrogenate was added in an amount of 10 mol % instead of 1 mol %, so as to prepare a solid electrolyte according to Experimental Example 12-3.

FIG. 7 is a differential scanning calorimetry (DSC) graph showing a compound according to Experimental Example 1-1 and a solid electrolyte according to Experimental Example 12-3 of the present invention.

Referring to FIG. 7, a solid-liquid or solid-solid state change according to temperature may be observed in the compound according to Experimental Example 1-1 and the solid electrolyte according to Experimental Example 12-3.

As shown in FIG. 7, the solid-liquid state change was observed in the compound at 90° C. In this case, an entropy of fusion of the compound was calculated to be 32 J/K mol. In contrast, the solid-liquid state change was observed in the solid electrolyte at 70° C. In this case, an entropy of fusion of the solid electrolyte was calculated to be 24 J/K mol.

In addition, the solid-solid state change was observed twice in the compound. Accordingly, it was confirmed that the compound has a first crystal phase in a temperature range of 28 to 90° C. and a second crystal phase in a temperature range of 22 to 28° C. In contrast, it was confirmed that the solid-solid state change is observed once in the solid electrolyte, so as to have one crystal phase in a temperature range of 22 to 70° C.

Thus, the compound further includes the lithium salt, and a melting point (a temperature of solid-liquid state change) may decrease. Accordingly, it can be confirmed that the entropy of fusion required for the state change decreases. In addition, it can be confirmed that the compound further includes the lithium salt and a temperature of the solid-solid state change varies.

FIG. 8 is a graph showing an X-ray diffraction pattern (XRD) of a compound according to Experimental Example 1-1 and a solid electrolyte according to Experimental Example 12-2 of the present invention.

Referring to FIG. 8, a change in crystal structure may be observed in a solid electrolyte according to Experimental Example 12-2 compared to a compound according to Experimental Example 1-1.

As shown in FIG. 8, it was confirmed that the compound and the solid electrolyte have the same position of main peaks. In contrast, it was observed that the intensities of the peaks are different from each other. Accordingly, it can be understood that the solid electrolyte further includes a lithium-enriched phase and a crystal orientation is changed in the solid electrolyte compared to the compound.

As described above, the solid electrolyte may further include a phase having a different composition compared to the compound. In this case, the phase having a different composition is liquefied at a relatively low temperature, and thus the solid electrolyte may have a lower melting point compared to the compound, as described above in FIG. 2.

FIG. 9 is a graph showing an ion conductivity according to a temperature of compounds according to Experimental Examples 1-1 to 1-4 and compounds according to Experimental Examples 2-2, Experimental Examples 3-4, Experimental Examples 8-1, Experimental Examples 9-1, Experimental Examples 10-4 to 1-5 of the present invention.

Referring to FIG. 9, compounds according to Experimental Examples 1-1 to 1-4 and compounds according to Experimental Examples 2-2, Experimental Examples 3-4, Experimental Examples 8-1, Experimental Examples 9-1, Experimental Examples 10-4 include the same anion, in which the anion may be fluorohydrogenate. Accordingly, an ion conductivity according to a change of the cation may be compared.

The compounds according to the experimental examples 1-1~1-4 of the present invention showed a higher ion conductivity as a length of the alkyl group chain decreases. Specifically, the compound showed an ion conductivity of 46 to 126 mS/cm at room temperature, and the compound having a methyl group showed the highest ion conductivity of 126 mS/cm.

TABLE 3

|  | Alkyl group | Ion conductivity (mS/cm) |
| --- | --- | --- |
| Experimental Example 1-1 | Methyl group | 126 |
| Experimental Example 1-2 | Ethyl group | 103 |
| Experimental Example 1-3 | Propyl group | 68 |
| Experimental Example 1-4 | Butyl group | 46 |

FIG. 10 is a graph showing an ion conductivity according to a temperature of a compound according to Experimental Example 1-1 and solid electrolytes according to Experimental Examples 12-1 to 12-3 of the present invention.

Referring to FIG. 10, an ion conductivity according to a concentration of the compound according to Experimental Example 1-1 having the highest ion conductivity described above with reference to FIG. 5 and the lithium salt added to the compound was confirmed. The solid electrolyte further contained the lithium fluorohydrogenate in an amount of 1 to 10 mol % compared to the compound. As described above in FIG. 2, the solid electrolyte may have the lithium salt arbitrarily provided at interstitial sites of the crystal structure of the compound. Thus, the lithium salt may easily move within the crystal structure, and thus it was observed that the solid electrolyte has a higher ion conductivity as an amount of lithium fluorohydrogenate added increases.

In this case, the lithium salt may move to interstitial sites where the lithium salt is not provided, and may show an ion conductivity. Thus, with an increase in the interstitial sites where the lithium salt is provided, the lithium salt may not relatively easily move. Accordingly, it was observed that the ion conductivity substantially reaches saturation, if an amount of the lithium fluorohydrogenate added is 5 mol % or more.

FIG. 11 is a view showing pictures of an electrolyte membrane coated with a solid electrolyte according to an embodiment of the present invention.

Referring to FIG. 11, a picture was taken of a solid electrolyte membrane in the form of a film in which a solid electrolyte according to an embodiment of the present invention is coated on a polytetrafluoroethylene (PTFE) resin. In this case, it was confirmed that the solid electrolyte membrane maintains the softness and transparency of the resin.

FIGS. 12 and 13 are graphs showing results of a cycle test of a secondary battery including a solid electrolyte according to Experimental Example 12-2 of the present invention.

Referring to FIGS. 12 and 13, the charge/discharge properties of a secondary battery including the solid electrolyte in which the ion conductivity substantially reaches saturation as described above with reference to FIG. 11 was confirmed. In other words, the secondary battery included the solid electrolyte according to Experimental Example 12-2 of the present invention. In addition, the secondary battery included $LiFePO_4$ as a positive electrode, lithium metal as a negative electrode.

In this case, the secondary battery was subject to a cycle test at a rate of 1 C. In a first cycle, the secondary battery showed a coulombic efficiency of 99.5% and a capacity of 158.6 mAh/g. In a 250th cycle, the secondary battery showed a coulomb efficiency of 98% and a capacity of 155.5 mAh/g. Thus, it may be possible to provide the secondary battery that shows a coulomb efficiency close to 99% even in the 250th cycle and has excellent cycle stability.

FIG. 14 is a graph showing a capacity retention rate according to charge/discharge rate of a secondary battery including a solid electrolyte according to Experimental Example 12-2 of the present invention.

Referring to FIG. 14, a rate of the secondary battery manufactured with reference to FIGS. 12 and 13 was changed at every certain cycle, and thus a degree to which a capacity of the secondary battery is maintained was confirmed. In this case, a charge/discharge rate of the secondary battery increased to 0.1 to 5 C, and again decreased to 1 C. Accordingly, if the charge/discharge rate was 0.1, 0.5, 1, 2, 3 and 5 C, a discharge capacity was measured to be 161.0, 160.5, 158.6, 156.4, 153.8 and 148.9 mAh/g, respectively. Thus, it was confirmed that the secondary battery maintains a constant capacity regardless of a change in rate.

FIG. 15 is a graph showing an impedance according to a cycle test of a secondary battery including a solid electrolyte according to Experimental Example 12-2 of the present invention.

Referring to FIG. 15, in the secondary battery manufactured with reference to FIGS. 12 and 13, an interphase impedance ($R_{SEI}$) and an electron transfer impedance ($R_{CT}$) in the first cycle and the 250th cycle was measured. The interphase impedance and the electron transfer impedance in the first cycle were calculated to be 1.65 and 11.22Ω, respectively. In addition, the interphase impedance and the electron transfer impedance in the 250th cycle were calculated to be 1.75 and 11.65Ω, respectively. In the secondary battery, as a number of cycles increases, elements included in the components of the secondary battery may be subject to movement and diffusion. Accordingly, resistance in the secondary battery may increase, and charge/discharge properties of the secondary battery may decrease. However, it was observed that the secondary battery including the solid electrolyte according to an exemplary embodiment of the present invention shows a relatively low increase in the impedance in the 250th cycle. Thus, it can be confirmed that the secondary battery including the solid electrolyte according to an embodiment of the present invention has excellent chemical stability.

FIG. 16 is a graph showing a piezoelectric coefficient according to a temperature of an organic piezoelectric material according to an embodiment of the present invention.

Referring to FIG. 16, it can be confirmed that an organic piezoelectric material according to an experimental example of the present invention shows piezoelectric properties in a range before a temperature of phase transition. In this case, among the piezoelectric materials mainly used in the related art, barium titanium oxide ($BaTiO_3$), quartz, etc. are used as an inorganic matter, and PVDF, etc. is used as an organic matter, and the piezoelectric coefficients of the conventional piezoelectric materials are shown in a following <Table 4>.

TABLE 4

| Piezoelectric material | Types of piezoelectric material | Piezoelectric coefficient (pC/N) |
|---|---|---|
| [001] Direction, $BaTiO_3$ | Inorganic matter | 90 |
| PVDF | Organic matter | 23 |
| Quartz | Inorganic matter | 5 |

As can be understood from <Table 4> and FIG. 16, the organic piezoelectric material may have a piezoelectric coefficient of 109 pC/N at room temperature. Accordingly, it can be understood that the organic piezoelectric material has a higher piezoelectric coefficient than that of a conventional piezoelectric material.

As shown in FIG. 16, it was confirmed that the organic piezoelectric material has a piezoelectric coefficient of 105 to 125 pC/N in a temperature range of room temperature to 110° C. In addition, it was confirmed that the organic piezoelectric material is subject to a phase transition into a different crystal structure at 127° C., and thus the organic piezoelectric material does not have piezoelectric properties.

FIG. 17 is a graph showing a piezoelectric coefficient according to a frequency of an organic piezoelectric material according to an embodiment of the present invention.

Referring to FIG. 17, it was confirmed that the organic piezoelectric material has a piezoelectric coefficient of 105 to 125 pC/N in a frequency range of 25 to 250 Hz. In addition, a piezoelectric coefficient of the organic piezoelectric material was confirmed by increasing or decreasing a value of the frequency. In this case, it was confirmed that the compound has a piezoelectric coefficient corresponding to each frequency value.

FIG. 18 is a scanning electron microscopy (SEM) image of an organic piezoelectric material according to an embodiment of the present invention.

Referring to FIG. 18, a surface image of an organic piezoelectric material according to an experimental example of the present invention was photographed by a scanning electron microscope. Accordingly, it can be understood that the organic piezoelectric material may have a solid state at room temperature.

FIG. 19 is a piezoresponse force microscopy (PFM) image of an organic piezoelectric material according to an embodiment of the present invention.

Referring to FIG. 19, the piezoresponse force microscope applies an electric field to a sample from a tip of the piezoresponse force microscope, and thus a physical change such as expansion or compression may occur in the sample. A position of the tip of the piezoresponse force microscope may be changed according to the physical change, so as to generate a piezoresponse force microscopy image.

As shown in FIG. 19, a surface image of an organic piezoelectric material according to Experimental Example 1-1 of the present invention was confirmed through a piezoresponse force microscope.

FIG. 20 is a graph showing a measured ion conductivity of a compound according to Experimental Examples 2-1 to 2-4 of the present invention.

Referring to FIG. 20, an ion conductivity of compounds according to Experimental Examples 2-1 to 2-4 was measured. As a result of measurement shown in FIG. 20, in case of having a methyl group according to Experimental Example 2-1, an ion conductivity was measured to be 45 mS/cm$^2$ at room temperature. In case of having an ethyl group according to Experimental Example 2-2, an ion conductivity was measured to be 74 mS/cm$^2$. In case of having a propyl group according to Experimental Example 2-3, an ion conductivity was measured to be 18.9 mS/cm$^2$. In case of having a butyl group according to Experimental Example 2-4, an ion conductivity was measured to be 6.8 mS/cm$^2$.

Compounds according to Experimental Examples 2-1 to 2-4 of the present invention were measured to have a high ion conductivity. In particular, in case of having an ethyl group according to Experimental Example 2-2, a compound was measured to have the highest ion conductivity.

FIG. 21 is a differential scanning calorimetry (DSC) graph of a compound according to Experimental Example 2-1 of the present invention.

Referring to FIG. 21, a state change according to temperature is observed in the compound according to Experimental Example 2-1. Specifically, as shown in FIG. 21, it can be confirmed that the compound has a first crystal phase between −14° C. and 110° C. and a second crystal phase between −80° C. and −14° C.

FIG. 22 is a graph showing a measured electrochemical window of a compound according to Experimental Example 2-1 of the present invention.

Referring to FIG. 22, it can be confirmed that the compound according to Experimental Example 2-1 has an electrochemical window up to −3V to +3V in a range of about 6V.

In other words, according to an embodiment of the present invention, it can be confirmed that a compound, in which cations including thiazolium and anions including fluorohydrogenate are prepared, maintains a solid state in a wide temperature range, while maintaining electrochemical stability and high ion conductivity.

FIG. 23 is a graph showing an ion conductivity measured according to a temperature of compounds according to Experimental Examples 1-1, 11-7, 11-8, 11-15, 11-17 and 11-18 of the present application.

Referring to FIG. 23, an ion conductivity was measured according to a temperature of compounds according to Experimental Examples 1-1, 11-7, 11-8, 11-15, 11-17 and 11-18 of the present application.

As can be understood from FIG. 23, it may be confirmed that a compound has the highest ion conductivity, in case of including fluorohydrogenate as an anion according to Experimental Example 1-1, and it can be confirmed that a compound has the highest ion conductivity, in case of including cyano(nitro)methanide and tetrazolidine as an anion according to Experimental Examples 11-7 and 11-8.

FIG. 24 is a differential scanning calorimetry (DSC) graph showing a compound according to Experimental Examples 11-7 to 11-8 of the present application.

Referring to FIG. 24, a state change was observed according to a temperature of compounds according to Experimental Examples 11-7 and 11-8.

As can be understood from FIG. 24, it can be confirmed that the compounds according to Experimental Examples 11-7 and 11-8 stably maintain a solid crystal phase in a relatively wide range of temperatures. Specifically, it can be confirmed that the compound according to Experimental Example 11-7 and the compound according to Experimental Example 11-8 stably maintain a solid crystal phase −15 to 98° C. and at −59 to 129° C., respectively. In addition, the compounds according to Experimental Examples 11-7 and 11-8 have a somewhat low ion conductivity compared to the compound according to Experimental Example 1-1, but stably maintain a crystal phase in a range of temperatures wider than the range of temperatures (28 to 90° C.) in which the compound according to Experimental Example 1-1 stably maintains a first crystal phase as shown in FIG. 7. Accordingly, the compounds according to Experimental Examples 11-7 and 11-8 can be useful in military or space fields, or low-temperature environments such as an polar region.

FIGS. 25 and 26 are graphs showing an X-ray diffraction pattern (XRD) according to a temperature of a compound according to Experimental Example 1-1 of the present application.

Referring to FIGS. 25 and 26, an X-ray diffraction pattern (XRD) according to a temperature of a compound according to Experimental Example 1-1 was measured in the range of −50 to 80° C.

As can be understood from FIGS. 25 and 26, it can be confirmed that a main peak moves to the left as a temperature increases in the area of 20 to 80° C., and a peak corresponding to 2θ 53.6° and 85.4° disappears at a temperature of 70° C. or higher.

In addition, as a temperature increases, it can be observed that one peak changes to two peaks, and it can be understood that a peak intensity value decreases. In other words, as the temperature increases, it can be confirmed that a short range disordered amorphous crystal structure increases and thus sequentially changes to phase III (−50 to 25° C.), phase II (25 to 30° C.), and phase I (30° C. or higher) as shown in FIG. 26, and phase III, phase II, and phase I of FIG. 5 correspond to solid phase III, phase II, and phase I of FIG. 2, respectively.

FIG. 27 is a graph showing an NMR analysis result of a solid electrolyte according to Experimental Example 12-1 of the present application.

Referring to FIG. 27, an NMR analysis was performed for a solid electrolyte according to Experimental Example 12-1. (a) of FIG. 27 may be $6^1H$ NMR spectra, (b) of FIG. 27 may be $8^{19}F$ NMR spectra, and (c) of FIG. 27 may be $7^7Li$ NMR spectra.

It can be confirmed from (a), (b), and (c) of FIG. 27 that lithium is doped onto the compound in which cations and anions are bonded through lithium fluorohydrogenate.

FIG. 28 is a graph showing a chemical shift and diffusion coefficient measured according to a temperature of a solid electrolyte according to Experimental Example 12-1 of the present application.

Referring to FIG. 28, a chemical shift was measured according to a temperature of Li, H, and F of the solid electrolyte according to Experimental Example 12-1, and a diffusion coefficient of Li ions, cations, and anions of the solid electrolyte according to Experimental Example 12-1 was measured.

As can be understood from FIG. 28, a diffusion coefficient of Li ions of the solid electrolyte of Experimental Example 12-1 was measured to be $10^{-8}$ to $10^{-9}$ $m^2s^{-1}$, which is generally at a remarkably high level compared to the solid electrolyte in which cations and anions are bonded.

Although the present invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

INDUSTRIAL APPLICABILITY

According to an embodiment of the present invention, a solid electrolyte and a secondary battery including the same can be used in various fields of industry such as portable electronic devices, electric vehicles, ESS, etc.

The invention claimed is:
1. A solid electrolyte comprising a compound in which cations including one of thiophenium or thiazolium, and anions including fluorohydrogenate are bonded.
2. The solid electrolyte of claim 1, wherein the cation is thiophenium, the compound includes an alkyl group bonded with a sulfur element of the thiophenium, and the alkyl group includes one of a methyl group, an ethyl group, a propyl group or a butyl group.
3. The solid electrolyte of claim 2, wherein the cation is thiophenium, and the compound has an ion conductivity that decreases as a chain of the alkyl group becomes longer.
4. The solid electrolyte of claim 1, wherein the cation is thiophenium, and the compound includes a methyl group bonded with a sulfur element of the thiophenium, and has a first crystal phase in a temperature range of 28 to 90° C. and a second crystal phase in a temperature range of 22 to 28° C. in a heat flow spectrum according to temperature by differential scanning calorimetry (DSC).
5. The solid electrolyte of claim 1, wherein the cation is thiophenium and the solid electrolyte further comprises lithium salt, in which a unit cell of the compound has an orthorhombic crystal structure, the cation is provided at a vertex and at a center of a face of the crystal structure, the anion is provided in a middle of an edge of the crystal structure, and the lithium salt is arbitrarily provided at interstitial sites of the crystal structure.
6. The solid electrolyte of claim 5, wherein an ion conductivity increases as a concentration of the lithium salt increases.
7. The solid electrolyte of claim 1, wherein the cation is thiophenium, a methyl group bonded with a sulfur element of the thiophenium is provided, and the solid electrolyte has a crystal phase in a temperature range of 28 to 70° C. in a heat flow spectrum according to temperature by differential scanning calorimetry (DSC).
8. A secondary battery comprising:
a positive electrode;
a negative electrode; and
an electrolyte positioned between the positive electrode and the negative electrode, in which the electrolyte includes the compound according to claim 1, and lithium salt.
9. The solid electrolyte of claim 1, wherein the cation is thiazolium, the compound includes an alkyl group bonded with a nitrogen element of the thiazolium, and the alkyl group includes one of a methyl group, an ethyl group, a propyl group or a butyl group.
10. The solid electrolyte of claim 1, wherein the cation is thiazolium, and the compound includes an ethyl group bonded with a nitrogen element of the thiazolium.
11. The solid electrolyte of claim 1, wherein the cation is thiazolium, and the solid electrolyte further comprises lithium salt.

12. A solid electrolyte comprising a compound in which cations and anions are bonded, wherein
the cations include thiophenium, and
the anions include one of fluorohydrogenate, cyano(nitroso)methanide or tetrazolidine.

13. A secondary battery comprising:
a positive electrode;
a negative electrode; and
a solid electrolyte positioned between the positive electrode and the negative electrode,
wherein the solid electrolyte comprises a compound in which a cation and an anion are bonded,
wherein the cation includes thiophenium, and
wherein the anion includes one of fluorohydrogenate, cyano(nitroso)methanide or tetrazolidine.

* * * * *